(12) United States Patent
Yeh et al.

(10) Patent No.: US 12,327,594 B2
(45) Date of Patent: Jun. 10, 2025

(54) 3D FLASH MEMORY MODULE CHIP AND METHOD OF FABRICATING THE SAME

(71) Applicant: MACRONIX International Co., Ltd., Hsinchu (TW)

(72) Inventors: Teng-Hao Yeh, Hsinchu County (TW); Hang-Ting Lue, Hsinchu (TW)

(73) Assignee: MACRONIX International Co., Ltd., Hsinchu (TW)

( * ) Notice: Subject to any disclaimer, the term of this patent is extended or adjusted under 35 U.S.C. 154(b) by 776 days.

(21) Appl. No.: 17/569,419

(22) Filed: Jan. 5, 2022

(65) Prior Publication Data
US 2023/0134957 A1    May 4, 2023

Related U.S. Application Data

(60) Provisional application No. 63/273,876, filed on Oct. 29, 2021.

(51) Int. Cl.
| | | |
|---|---|---|
| *G11C 16/10* | (2006.01) | |
| *G11C 5/02* | (2006.01) | |
| *G11C 16/04* | (2006.01) | |
| *H01L 23/34* | (2006.01) | |

(52) U.S. Cl.
CPC .............. *G11C 16/10* (2013.01); *G11C 5/025* (2013.01); *G11C 16/0483* (2013.01); *H01L 23/345* (2013.01)

(58) Field of Classification Search
CPC . G11C 16/10; G11C 16/0483; G11C 16/3495; G11C 5/025; G11C 5/04; G11C 5/063; G11C 29/82; H01L 23/345; H01L 25/16; H01L 25/0652; H01L 25/0655; H01L 25/50; H10B 41/20; H10B 41/35; H10B 41/40; H10B 41/41; H10B 41/42; H10B 43/00
See application file for complete search history.

(56) References Cited

U.S. PATENT DOCUMENTS

| | | | |
|---|---|---|---|
| 7,683,459 B2 * | 3/2010 | Ma | .............. H01L 23/481 |
| | | | 257/621 |
| 9,286,991 B1 | 3/2016 | Walker | |
| 10,916,308 B2 | 2/2021 | Lue | |

(Continued)

FOREIGN PATENT DOCUMENTS

| | | |
|---|---|---|
| CN | 109075167 | 12/2018 |
| JP | H0831187 | 2/1996 |

(Continued)

OTHER PUBLICATIONS

"Office Action of Japan Counterpart Application", issued on Apr. 28, 2023, p. 1-p. 5.

(Continued)

*Primary Examiner* — Dale E Page
*Assistant Examiner* — Quovaunda Jefferson
(74) *Attorney, Agent, or Firm* — J.C. PATENTS

(57) ABSTRACT

A 3D flash memory module chip includes a memory chip and a control chip. The memory chip includes a plurality of tiles and a plurality of heaters. The tiles each include a plurality of 3D flash memory structures. The heaters are disposed around the 3D flash memory structures of each of the tiles. The control chip is bonded with the memory chip to drive at least one of the heaters.

15 Claims, 18 Drawing Sheets

(56) References Cited

U.S. PATENT DOCUMENTS

| | | |
|---|---|---|
| 2010/0025811 A1 | 2/2010 | Bronner et al. |
| 2012/0327719 A1 | 12/2012 | Lue |
| 2016/0172044 A1 | 6/2016 | Lu et al. |
| 2019/0221557 A1 | 7/2019 | Kim et al. |
| 2020/0381050 A1 | 12/2020 | Lue |
| 2021/0074716 A1 | 3/2021 | Lim et al. |

FOREIGN PATENT DOCUMENTS

| | | |
|---|---|---|
| JP | 2010538497 | 12/2010 |
| TW | 201438014 | 10/2014 |
| TW | 202101681 | 1/2021 |
| TW | 202114181 | 4/2021 |
| TW | I738412 | 9/2021 |
| WO | 2011022123 | 2/2011 |

OTHER PUBLICATIONS

Hang-Ting Lue et al., "A Novel Micro Wall Heater for Thermally-Assisted 3D AND-type Flash Memory to Radically Boost the Write/Erase Speed and Endurance for the Applications of Write-Intensive Persistent Memory," 2021 Symposium on VLSI Technology, Jun. 2021, pp. 1-2.

"Office Action of Korea Counterpart Application", issued on Aug. 24, 2023, p. 1-p. 7.

"Search Report of Europe Counterpart Application", issued on Jul. 4, 2022, p. 1-p. 8.

"Office Action of Taiwan Counterpart Application", issued on Sep. 6, 2022, p. 1-p. 6.

* cited by examiner

3D FLASH MEMORY MODULE CHIP AND METHOD OF FABRICATING THE SAME

CROSS-REFERENCE TO RELATED APPLICATION

This application claims the priority benefit of U.S. provisional application Ser. No. 63/273,876, filed on Oct. 29, 2021. The entirety of the above-mentioned patent application is hereby incorporated by reference herein and made a part of this specification.

BACKGROUND

Technical Field

The embodiment of the disclosure relates to a semiconductor module and a method of fabricating the same, and particularly, to a 3D flash memory module and a method of fabricating the same.

Description of Related Art

Since a non-volatile memory has the advantage that stored data does not disappear at power-off, it becomes a widely used memory for a personal computer or other electronics equipment. Currently, the three-dimensional (3D) memory commonly used in the industry includes a NOR flash memory and a NAND flash memory. In addition, another type of 3D memory is an AND flash memory, which can be applied to a multi-dimensional memory array with high integration and high area utilization, and has an advantage of a fast operation speed. Therefore, the development of a 3D memory device has gradually become the current trend.

SUMMARY

The disclosure provides a 3D flash memory module chip and a method of fabricating the same, which can perform a local healing process on a flash memory.

In an embodiment of the disclosure, a 3D flash memory module chip includes a memory chip and a control chip. The memory chip includes a plurality of tiles and a plurality of heaters. The tiles each include a plurality of 3D flash memory structures. The heaters are disposed around the 3D flash memory structures of each of the tiles. The control chip is bonded with the memory chip to drive at least one of the heaters.

In an embodiment of the disclosure, a method of fabricating a 3D flash memory module chip includes the following steps. A memory chip is formed, the step including forming a plurality of tiles on a first substrate, each of the tiles including a plurality of 3D flash memory structures; and forming a plurality of heaters around the 3D flash memory structures of each of the tiles. A control chip is formed. The control chip and the memory chip are bonded, and the control chip is configured to drive the heaters.

Based on the above, in the 3D flash memory module chip and the method of fabricating the same according to the disclosure, an additional control chip is used to drive the heater to perform a local healing process on each sector of the flash memory. The control chip may be manufactured separately to prevent the heater controller from occupying the area of the memory chip, and the control chip may be manufactured by a less advanced process to reduce the cost of the process.

DESCRIPTION OF THE EMBODIMENTS

The performance of a flash memory is significantly reduced after multiple operations, so it is necessary to perform a healing process on the flash memory. In the healing process, a heater may be used to heat the flash memory to heal a charge storage structure (e.g., a nitride layer) of the flash memory. In the current art, word lines are most commonly used as the heater. However, due to the large number of word lines and the complicated configuration relationship with other components (e.g., a word line decoder), the layout design of the flash memory structure may be more difficult.

The embodiments of the disclosure provide several 3D flash memory module chips, in which a heater is disposed above, or around sidewalls of, a 3D flash memory structure of a memory chip, and the memory chip is bonded with a control chip so that the control chip can drive a heater to perform a healing process on a local sector of the memory chip.

Figure 1A:
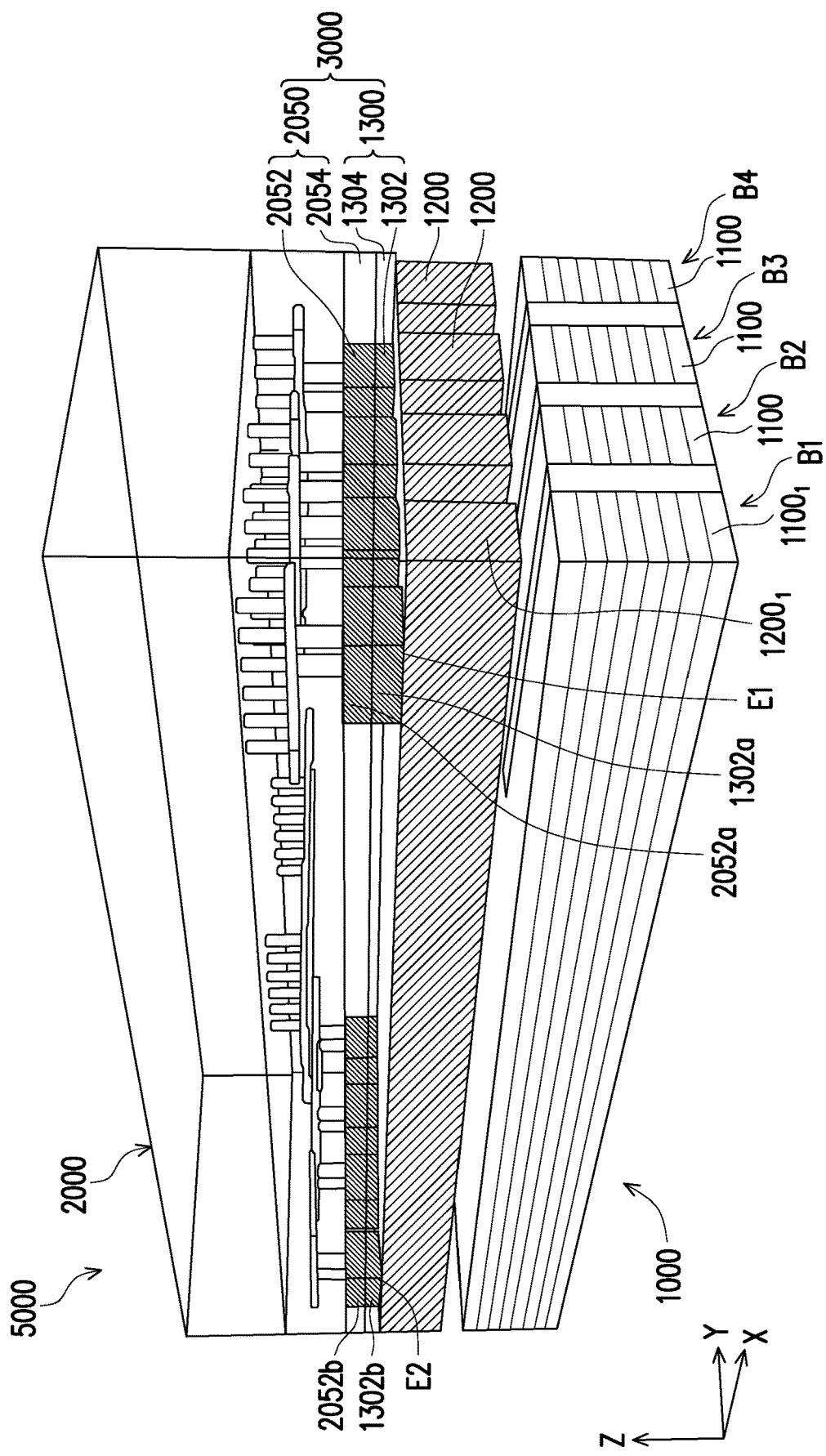
FIG. 1A and FIG. 1B are respectively schematic perspective views of a 3D flash memory module chip according to an embodiment of the disclosure.
Figure 1B:
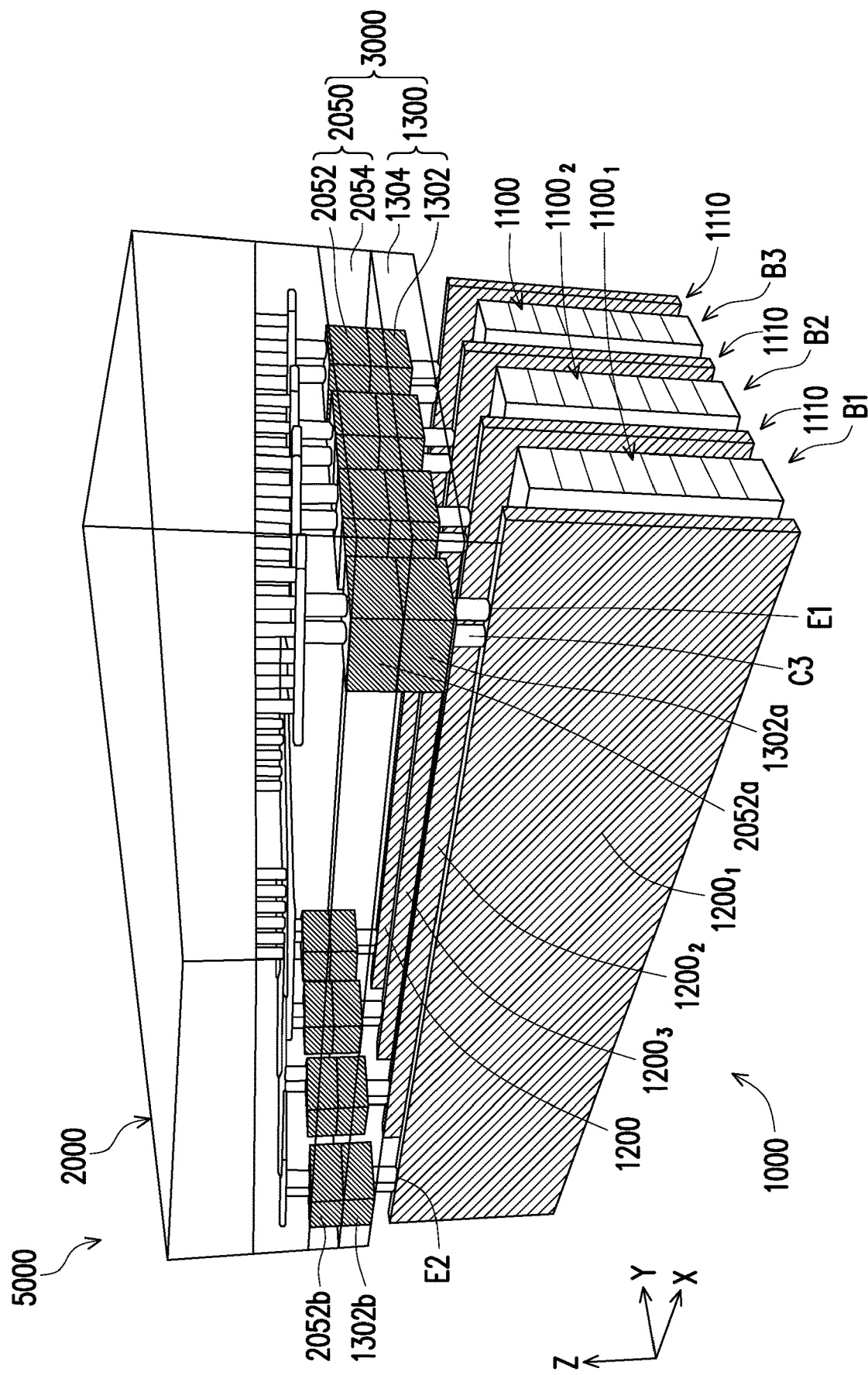
Figure 2A:
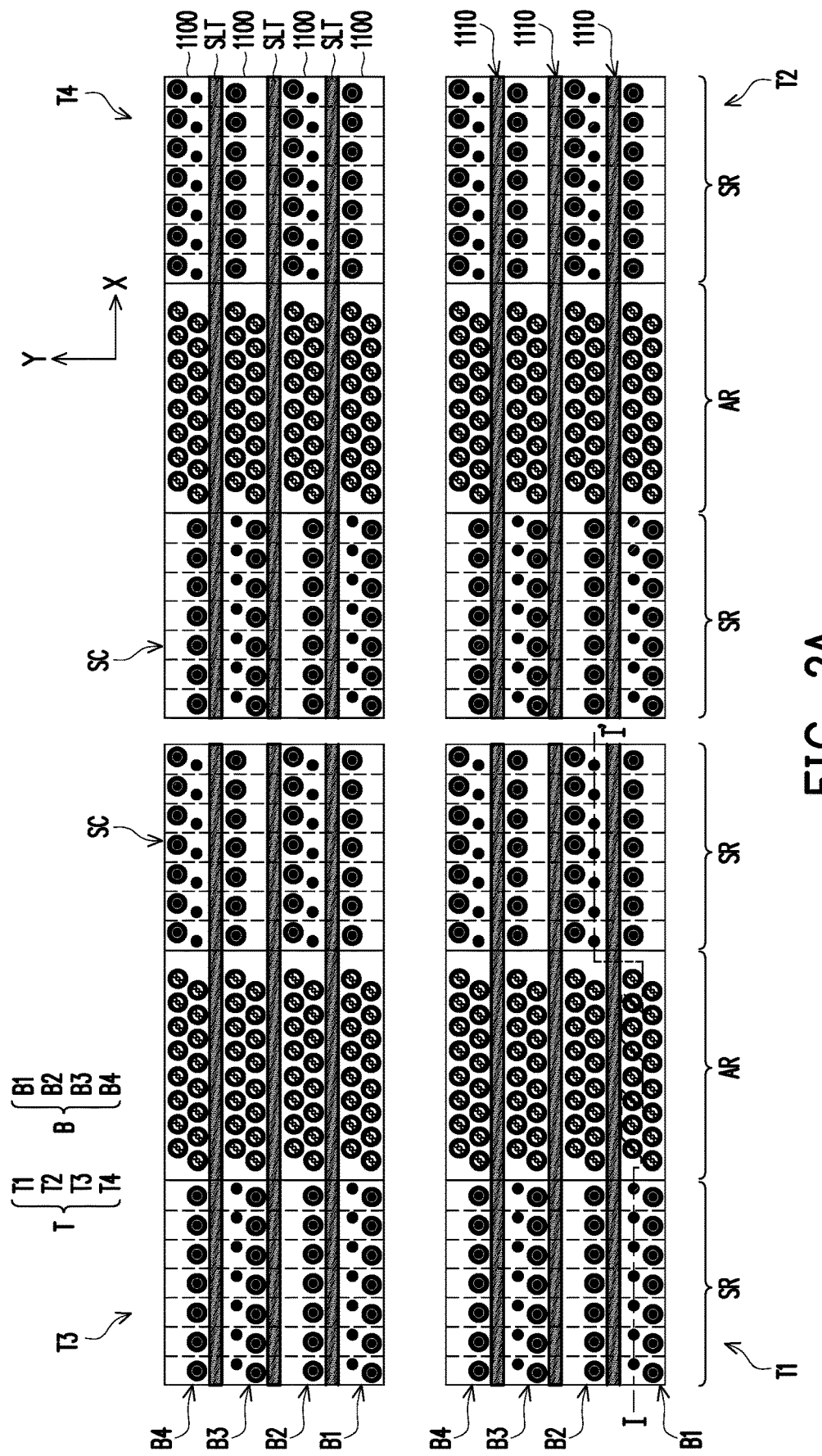
FIG. 2A is a partial top view of a 3D flash memory structure of a memory chip according to an embodiment of the disclosure.
Figure 2B:
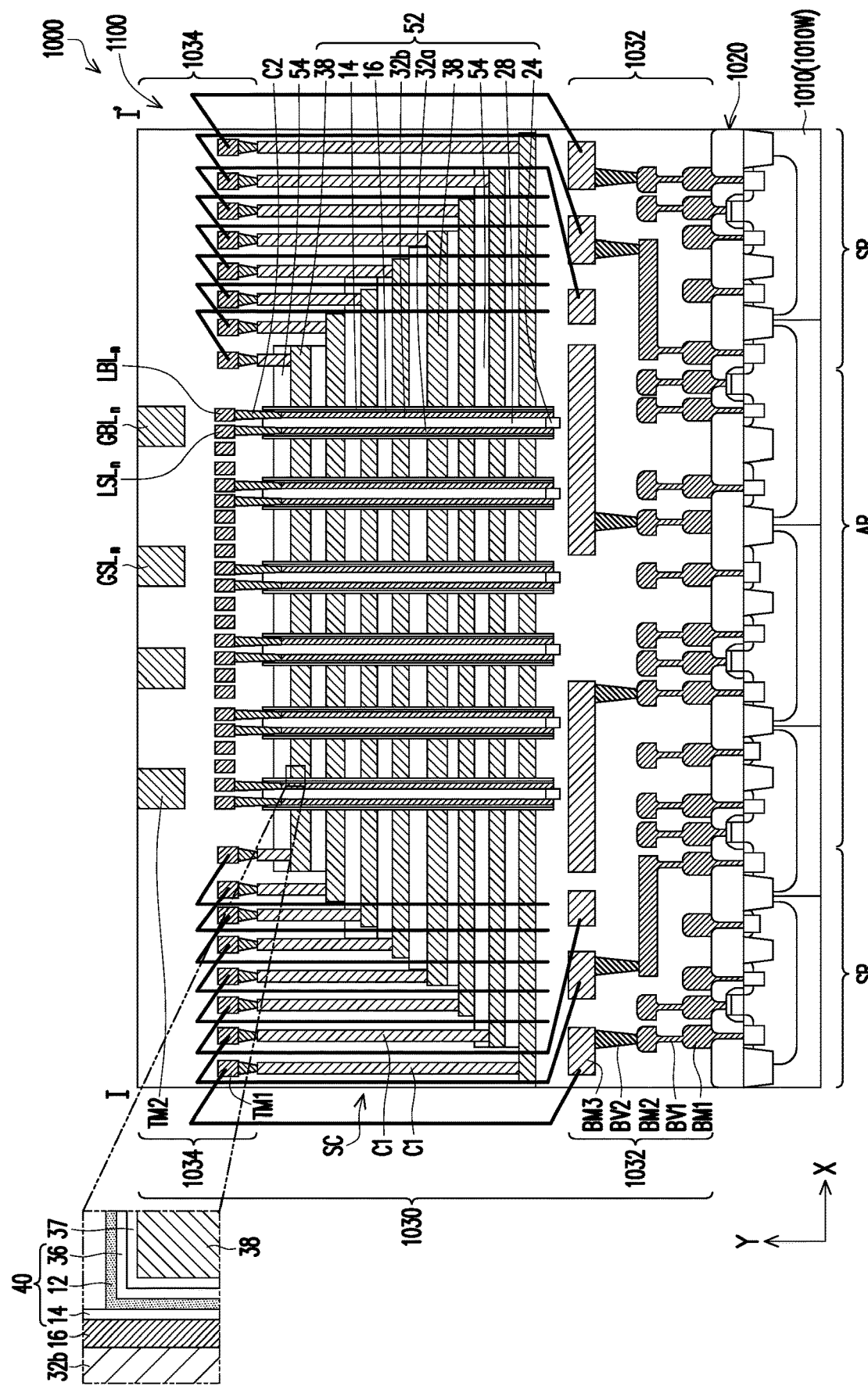
FIG. 2B is a cross-sectional view taken along line I-I' of FIG. 2A.
Figure 3A:
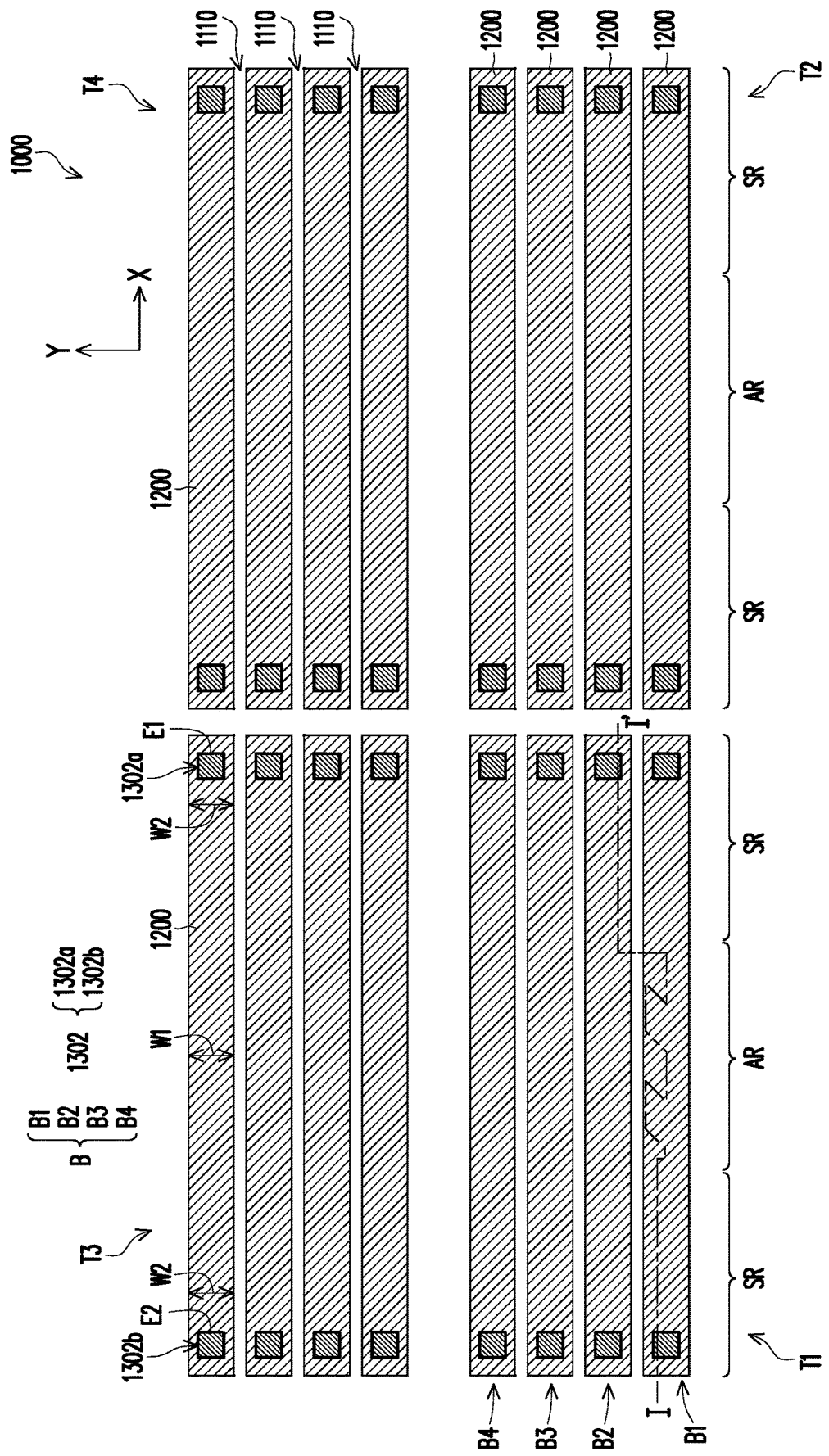
FIG. 3A is a partial top view of a memory chip having a heater according to another embodiment of the disclosure.
Figure 3B:
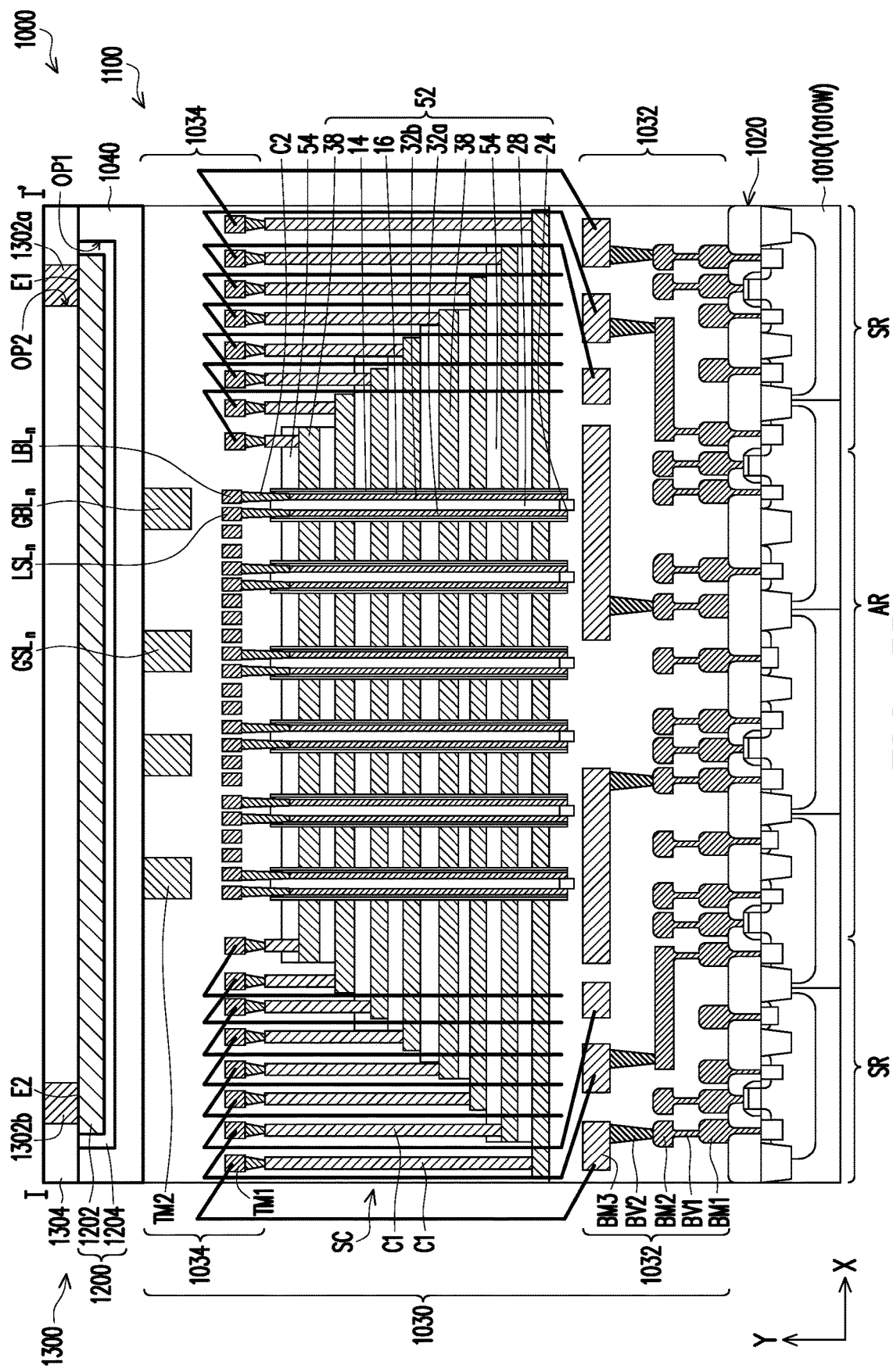
FIG. 3B is a cross-sectional view taken along line I-I' of FIG. 3A.

FIG. 1A and FIG. 1B are respectively schematic perspective views of a 3D flash memory module chip according to an embodiment of the disclosure. FIG. 2A is a partial top view of a 3D flash memory structure of a memory chip according to an embodiment of the disclosure. FIG. 2B is a cross-sectional view taken along line I-I' of FIG. 2A. FIG. 3A is a partial top view of a memory chip having a heater according to another embodiment of the disclosure. FIG. 3B is a cross-sectional view taken along line I-I' of FIG. 3A.

Referring to FIG. 1A and FIG. 1B, a 3D flash memory module chip (also referred to as a 3D integrated circuit (3D IC)) 5000 according to an embodiment of the disclosure includes a memory chip 1000 and a control chip 2000. The memory chip 1000 includes a plurality of 3D flash memory structures 1100 and a plurality of heaters 1200. The heaters 1200 are disposed around the 3D flash memory structures 1100. In some embodiments, the heaters 1200 are disposed above the 3D flash memory structures 1100, as shown in FIG. 1A. In other embodiments, the heaters 1200 are disposed in slit trenches 1110 between the 3D flash memory structures 1100, as shown in FIG. 1B. The control chip 2000 is disposed above the memory chip 1000 to drive the heaters 1200 in the memory chip 1000. The control chip 2000 and the memory chip 1000 may be bonded to each other by a bonding structure 3000.

Referring to FIG. 1A and FIG. 1B, the 3D flash memory structure 1100 of the memory chip 1000 may be a 3D AND flash memory structure (as shown in FIG. 2A and FIG. 2B), a 3D NAND flash memory structure (not shown), or a 3D NOR flash memory structure (not shown). The 3D AND flash memory structure will be taken as an example to illustrate the 3D flash memory structure 1100 of the disclosure, but the embodiment of the disclosure is not limited thereto.

Referring to FIG. 2A and FIG. 2B, the memory chip 1000 may include a plurality of tiles T. The tiles T may be arranged in an array including a plurality of columns and a plurality of rows. In this embodiment, four tiles T (e.g., T1 to T4) are shown for illustration. Among the four tiles T, the tile T1 and the tile T2 are arranged in a row, and the tile T3 and the tile T4 are arranged in another row. The tile T1 and the tile T3 are arranged in a column, and the tile T2 and the tile T4 are arranged in another column. Each of the tiles T may include a plurality of sectors B (e.g., B1 to B4). Each of the sectors B includes a 3D flash memory structure 1100. The 3D flash memory structures 1100 extend in the X direction and are arranged in the Y direction. Two adjacent 3D flash memory structures 1100 are separated from each other by a slit trench 1110.

Referring to FIG. 2B, each of the 3D flash memory structures 1100 may include at least a memory array formed by a plurality of memory cells. Specifically, the 3D flash memory structure 1100 may be disposed above one or more active devices (e.g., first transistors 1020) on a first substrate (e.g., a semiconductor substrate) 1010. The first transistor 1020 is, for example, a complementary metal-oxide-semiconductor (CMOS) field-effect transistor. Therefore, this architecture may also be referred to as a complementary metal-oxide-semiconductor field-effect transistor under array (CMOS under Array (CUA)) architecture.

Referring to FIG. 2B, the 3D flash memory structure 1100 may be disposed in a back end of line (BEOL) of a semiconductor die. For example, the 3D flash memory structure 1100 may be embedded in a first interconnect structure 1030. The first interconnect structure 1030 includes, for example, a lower interconnect structure 1032 and an upper interconnect structure 1034. The lower interconnect structure 1032 is disposed above one or more active devices (e.g., the first transistors 1020) on the first substrate (e.g., the semiconductor substrate) 1010 and below the memory array of the 3D flash memory structure 1100. The upper interconnect structure 1034 is disposed above the memory array of the 3D flash memory structure 1100. The lower interconnect structure 1032 includes, for example, a lower first metal layer BM1, a lower second metal layer BM2, and a lower third metal layer BM3, and vias BV1 and BV2 therebetween. The upper interconnect structure 1034 includes, for example, an upper first metal layer TM1 and an upper second metal layer TM2, and vias TV1 therebetween. The numbers of the metal layers and the vias of the lower interconnect structure 1032 and the upper interconnect structure 1034 are not limited to the above.

Referring to FIG. 2B, the 3D flash memory structure 1100 includes a plurality of gate stack structures 52. Each of the gate stack structures 52 is formed on the lower interconnect structure 1032. Each of the gate stack structures 52 extends in the X direction, from an array region AR to staircase regions SR of the first substrate 1010. The gate stack structure 52 includes a plurality of gate layers (also referred to as word lines) 38 and a plurality of insulating layers 54 vertically stacked on the surface of the first substrate 1010. In the Z direction, the gate layers 38 are electrically isolated from each other by the insulating layers 54 disposed therebetween. The gate layer 38 includes a metal layer such as tungsten. In some embodiments, the gate layer 38 further includes a barrier layer 37, such as titanium (Ti), titanium nitride (TiN), tantalum (Ta), tantalum nitride (TaN), or a combination thereof. The insulating layer 54 is, for example, silicon oxide.

The gate layer 38 extends in a direction parallel to the surface of the first substrate 1010 (shown in FIG. 2B). The gate layers 38 in the staircase region SR may have a staircase structure SC (shown in FIG. 2B), so that a lower gate layer 38 is longer than an upper gate layer 38, and the end of a lower gate layer 38 extends laterally beyond the end of an upper gate layer 38. A contact C1 for connecting the gate layer 38 may land on the end of the gate layer 38 in the staircase region SR to connect each of the gate layers 38 to conductive lines of the lower interconnect structure 1032 (e.g., the conductive line of the lower third metal layer BM3) via the contact C1 and the upper interconnect structure 1034.

Referring to FIG. 2B, the 3D flash memory structure 1100 further includes a plurality of channel pillars 16. The channel pillar 16 continuously extends through the gate stack structure 52 in the array region AR. In some embodiments, the channel pillar 16 may have a ring-shaped profile in a top view. The material of the channel pillar 16 may be a semiconductor, such as undoped polysilicon.

Referring to FIG. 2B, the 3D flash memory structure 1100 further includes an insulating filling layer 24, an insulating pillar 28, a plurality of conductive pillars (e.g., serving as source pillars) 32a, and a plurality of conductive pillars (e.g., serving as drain pillars) 32b. The conductive pillars 32a and 32b and the insulating pillar 28 are disposed in the channel pillar 16 and each extend in a direction (i.e., the Z direction) perpendicular to the gate layer 38. The conductive pillars 32a and 32b are separated from each other by the insulating filling layer 24 and the insulating pillar 28 and are electrically coupled to the channel pillar 16. The conductive pillars 32a and 32b are, for example, doped polysilicon. The insulating filling layer 24 is, for example, silicon oxide, the insulating pillar 28 is, for example, silicon nitride.

Referring to FIG. 2B, a charge storage structure 40 is disposed between the channel pillar 16 and the gate layers 38. The charge storage structure 40 may include a tunneling layer (or referred to as a bandgap engineered tunneling oxide layer) 14, a charge storage layer 12, and a blocking layer 36. The charge storage layer 12 is located between the tunneling layer 14 and the blocking layer 36. In some embodiments, the tunneling layer 14, the charge storage layer 12, and the blocking layer 36 are, for example, silicon oxide, silicon nitride, and silicon oxide. In some embodiments, a part (e.g., the tunneling layer 14) of the charge storage structure 40 continuously extends in a direction (i.e., the Z direction) perpendicular to the gate layer 38, and the other part (e.g., the charge storage layer 12 and the blocking layer 36) of the charge storage structure 40 surrounds the gate layer 38, as shown in FIG. 2B. In other embodiments, the charge storage structure 40 (e.g., the tunneling layer 14, the charge storage layer 12, and the blocking layer 36) surrounds the gate layer 38 (not shown). Each of the gate layers 38, and the charge storage structure 40, the channel pillar 16, the source pillar 32a, and the drain pillar 32b that are surrounded by the gate layer 38 define a memory cell 20. Therefore, each of the 3D flash memory structures 1100 includes at least a memory array composed of a plurality of memory cells 20.

The 3D flash memory structure 1100 further includes a local bit line $LBL_n$, a local source line $LSL_n$, a global bit line $GBL_n$, and a global source line $GSL_n$. The local bit line $LBL_n$, and the local source line $LSL_n$, are located in the upper first metal layer TM1 of the upper interconnect structure 1034, and are respectively electrically connected to the source pillar 32a and the drain pillar 32b via contacts C2. The global bit line $GBL_n$ and the global source line $GSL_n$ are respectively electrically connected to the local bit line $LBL_n$ and the local source line $LSL_n$ via upper vias (not shown) in the upper interconnect structure 1034.

According to different operation methods, a 1-bit operation or a 2-bit operation may be performed on the memory cell 20. For example, when a voltage is applied to the source pillar 32a and the drain pillar 32b, since the source pillar 32a and the drain pillar 32b are connected to the channel pillar 16, electrons may be transferred along the channel pillar 16 and stored in the entire charge storage structure 40. Accordingly, a 1-bit operation may be performed on the memory cell 20. In addition, for an operation involving Fowler-Nordheim tunneling, electrons or holes may be trapped in the charge storage structure 40 between the source pillar 32a and the drain pillar 32b. For an operation involving source side injection, channel-hot-electron injection, or band-to-band tunneling hot carrier injection, electrons or holes may be locally trapped in the charge storage structure 40 adjacent to one of the source pillar 32a and the drain pillar 32b. Accordingly, a single level cell (SLC, 1 bit) or multi-level cell (MLC, greater than or equal to 2 bits) operation may be performed on the memory cell 20.

During operation, a voltage is applied to a selected word line (gate layer) 38; for example, when a voltage higher than a corresponding threshold voltage ($V_{th}$) of the corresponding memory cell 20 is applied, a channel region of the channel pillar 16 intersecting the selected word line 38 is turned on to allow a current to enter the drain pillar 32b from a local bit line $LBL_n$, flow to the source pillar 32a via the turned-on channel region, and finally flow to a local source line $LSL_n$.

Referring to FIG. 3A and FIG. 3B, the memory chip 1000 further includes a plurality of heaters 1200. The heater 1200 may be disposed in a dielectric layer 1040 above the 3D flash memory structure 1100. The material of the dielectric layer 1040 is, for example, silicon oxide. The heater 1200 includes a metal layer 1202, such as copper or tungsten. In some embodiments, the heater 1200 further includes a barrier layer 1204, such as titanium, tantalum, titanium nitride, tantalum nitride, or a combination thereof.

Referring to FIG. 3A, in some embodiments, one heater 1200 is disposed on each sector B, and two heaters 1200 of any two adjacent sectors B are separated from each other. The heater 1200 may extend in the X direction. In an embodiment, the heater 1200 is disposed in the array region AR and extends to the staircase regions SR (as shown in FIG. 3A and FIG. 3B). In an embodiment, the heater 1200 may be disposed in the array region AR but is not disposed in the staircase regions SR (not shown). In other words, the length of the heater 1200 may be greater than, equal to, or less than the length of the 3D flash memory structure 1100 in the X direction.

In addition, multiple heaters 1200 may be disposed on each sector B; for example, one heater 1200 may be disposed in the array region AR and the staircase regions SR respectively and may perform heating separately (not shown). However, the embodiment of the disclosure is not limited thereto. In another embodiment, multiple heaters 1200 of adjacent two, three, or more sectors B may also be combined into one heater (not shown) to simultaneously heat the 3D flash memory structures 1100 of multiple sectors B.

Referring to FIG. 3A, the shape of the heater 1200 in a top view is, for example, a rectangle or another shape. The heaters 1200 on multiple sectors B may have the same width or different widths. A width W1 of the heater 1200 in the array region AR is the same as a width W2 of the heater 1200 in the staircase region SR. However, the disclosure is not limited thereto. The shape of the heater 1200 may be changed according to the actual requirements or design. The width W1 of the heater 1200 in the array region AR may be greater than, equal to, or less than the width W2 of the heater 1200 in the staircase region SR.

Referring to FIG. 1A, FIG. 1B, and FIG. 3B, the memory chip 1000 further includes a bonding layer 1300. The bonding layer 1300 includes a pad 1302 and an insulating layer 1304. The insulating layer 1304 is disposed on the heater 1200. The material of the insulating layer 1304 is, for example, silicon oxide. The pad 1302 is disposed in the insulating layer 1304 on the surface of each of the heaters 1200. The material of the pad 1302 is, for example, copper. The pad 1302 includes pads 1302a and 1302b. The pads 1302a and 1302b are respectively connected to a first end E1 and a second end E2 of the heater 1200.

Figure 6A:
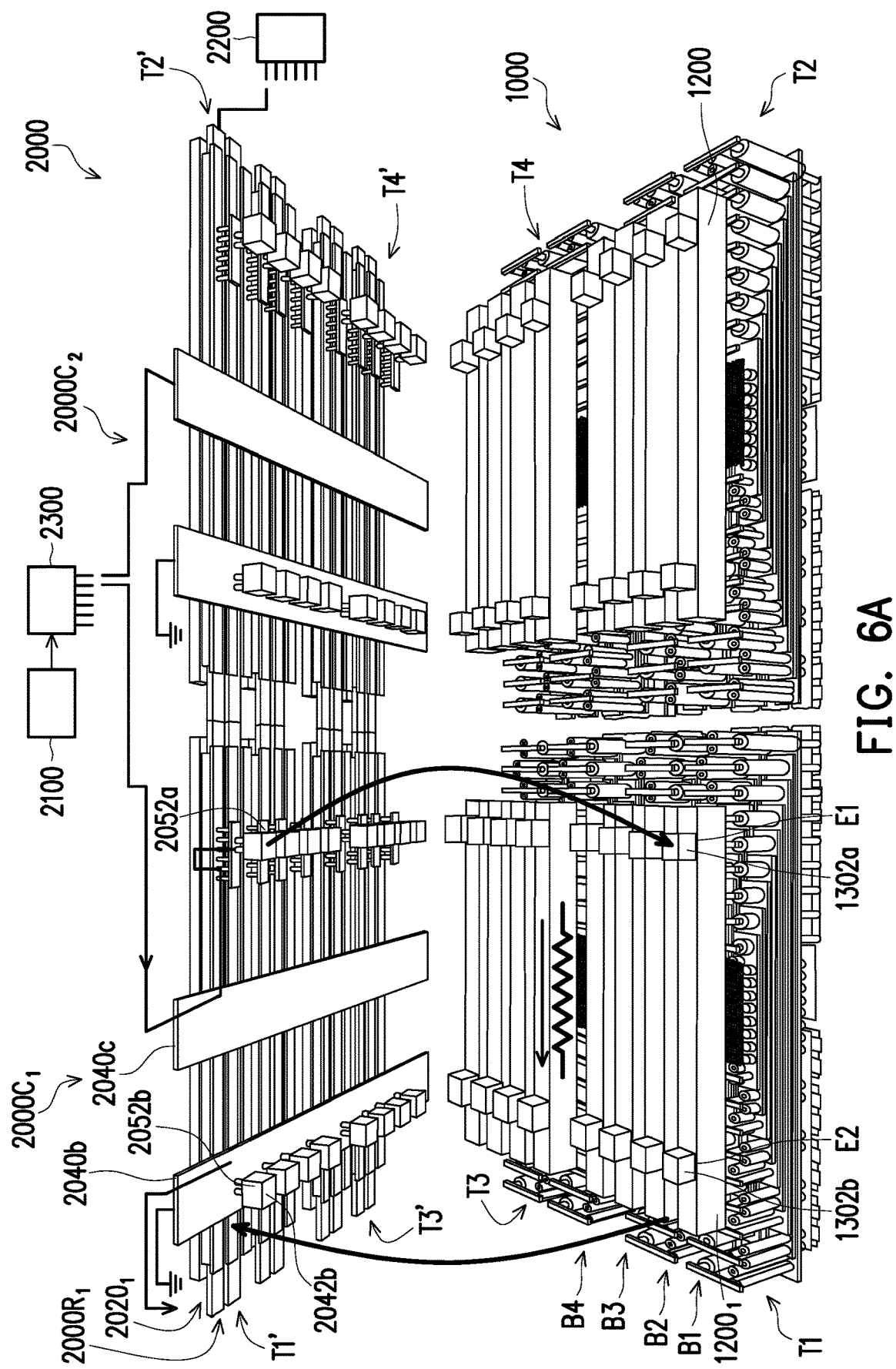
FIG. 6A is a schematic perspective view of a memory chip and a control chip according to an embodiment of the disclosure.

In the above embodiment, the 3D flash memory structures 1100 are 3D AND flash memory structures, and the heaters 1200 are disposed above the 3D AND flash memory structures (as shown in FIG. 3A, FIG. 3B, and FIG. 6A). In other embodiments, the 3D flash memory structures 1100 are 3D AND flash memory structures, and the heaters 1200 are disposed in slit trenches 1110 between the 3D AND flash memory structures (as shown in FIG. 4A to FIG. 4C).

Figure 4A:
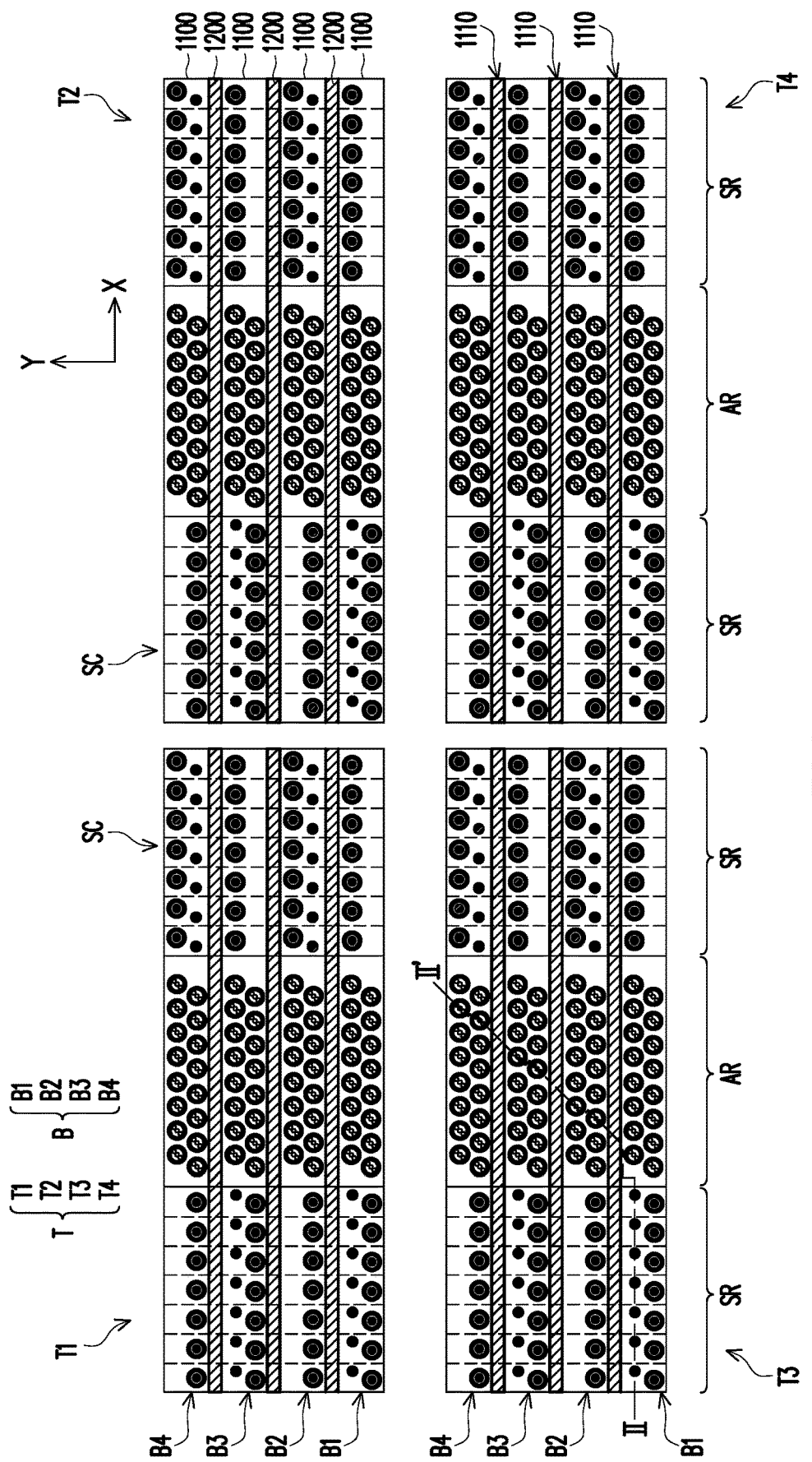
FIG. 4A is a partial top view of a memory chip having a heater according to another embodiment of the disclosure.
Figure 4B:
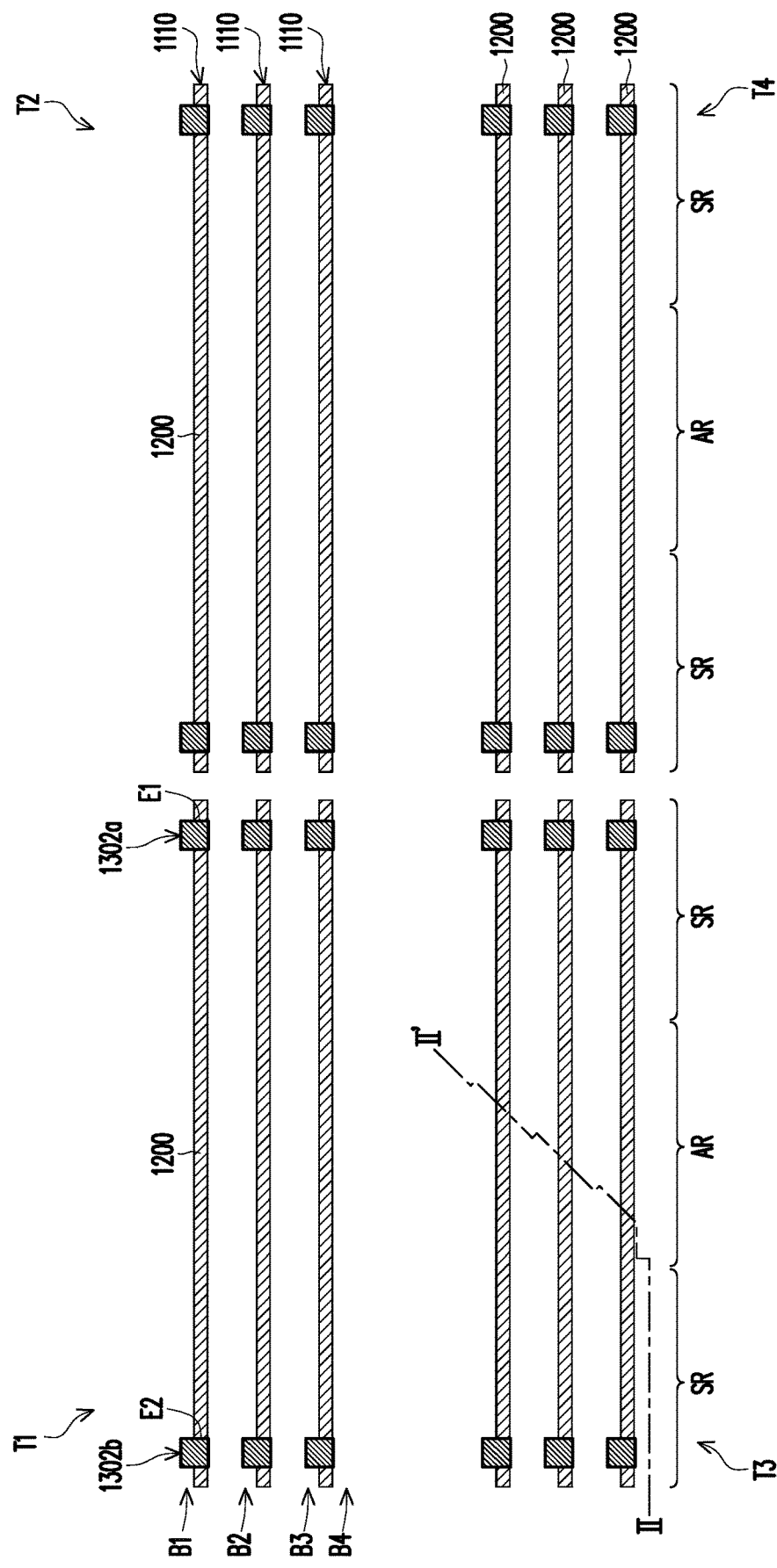
FIG. 4B is a partial top view of a heater and a pad of a memory chip according to another embodiment of the disclosure.

FIG. 4A is a partial top view of a memory chip having a heater according to another embodiment of the disclosure. FIG. 4B is a partial top view of a heater and a pad of a memory chip according to another embodiment of the disclosure. FIG. 4C is a cross-sectional view taken along line II-II' of FIG. 4B.

Figure 4C:
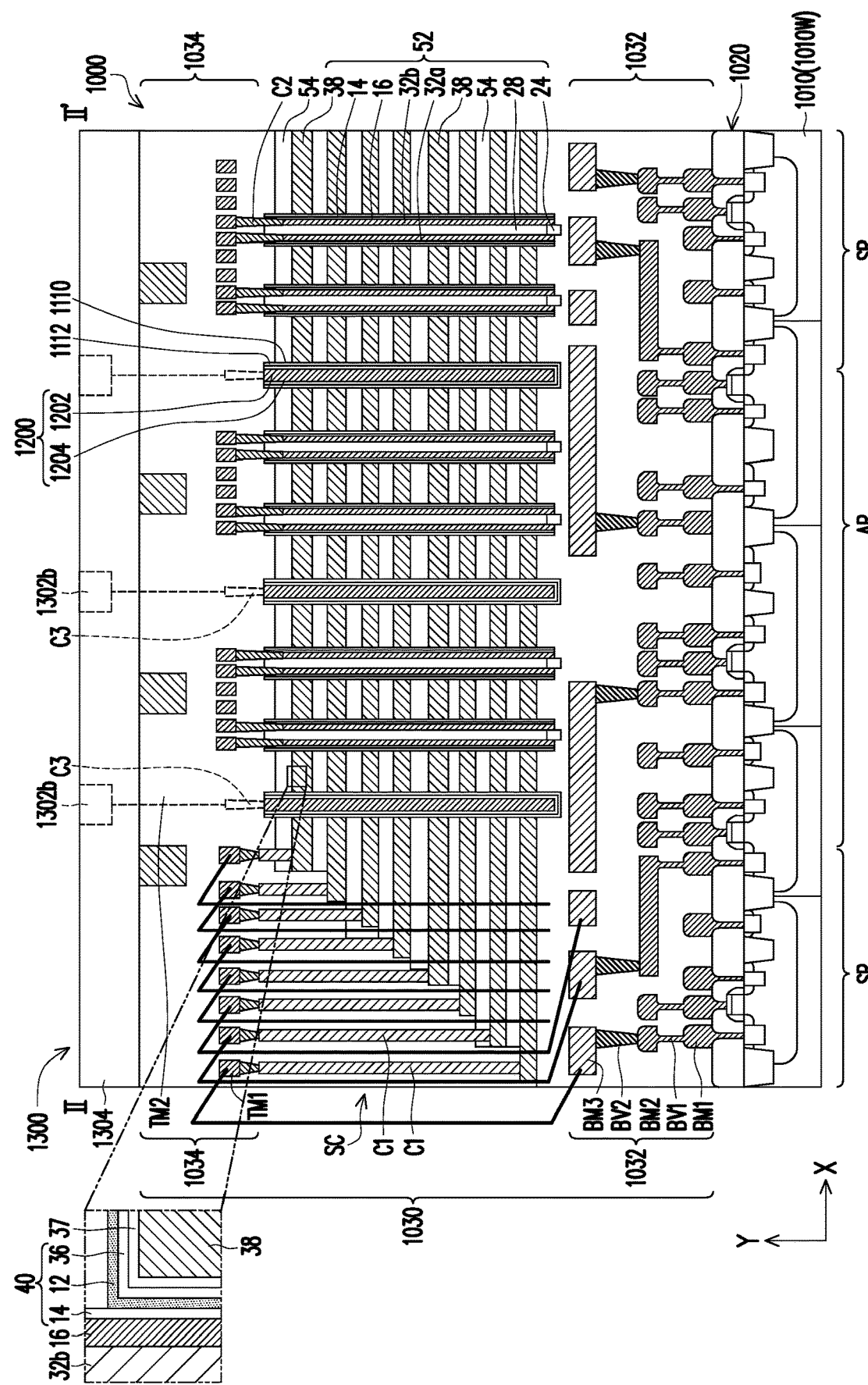
FIG. 4C is a cross-sectional view taken along line II-II' of FIG. 4B.

Referring to FIG. 4A and FIG. 4C, a plurality of heaters 1200 are disposed in slit trenches 1110 between 3D flash memory structures 1100. The heater 1200 is disposed around a plurality of gate layers 38 and a plurality of insulating layers 54 of a gate stack structure 52. The heater 1200 is separated from the gate layers 38 and the insulating layers 54 by an insulating liner layer 1112 (as shown in FIG. 4C). The insulating liner layer 1112 includes an insulating material such as silicon oxide or silicon nitride. The heater 1200 includes a metal layer 1202 (as shown in FIG. 4C), such as copper or tungsten. In some embodiments, the heater 1200 further includes a barrier layer 1204 (as shown in FIG. 4C). The barrier layer 1204 is located between the insulating liner layer 1112 and the metal layer 1202. The barrier layer 1204 is, for example, titanium, tantalum, titanium nitride, tantalum nitride, or a combination thereof.

In some embodiments, one heater 1200 is disposed in each of the slit trenches 1110. For example, the heater 1200 may extend in the X direction. In an embodiment, the heater 1200 is disposed in the array region AR and extends to the staircase regions SR (as shown in FIG. 4A and FIG. 4B). In an embodiment, the heater 1200 may be disposed in the array region AR but is not disposed in the staircase regions SR (not shown). In other words, the length of the heater 1200 may be greater than, equal to, or less than the length of the 3D flash memory structure 1100 in the X direction.

Alternatively, multiple heaters 1200 may be disposed in each of the slit trenches 1110. For example, one heater 1200 may be provided respectively in the array region AR and the staircase region SR, and heating may be performed separately (not shown). However, the embodiment of the disclosure is not limited thereto.

Referring to FIG. 4A, in addition, the shape of the heater 1200 in a top view is, for example, a rectangle or another shape. The heaters 1200 in multiple slit trenches 1110 may have the same width or different widths. However, the disclosure is not limited thereto. The shape of the heater 1200 may be changed according to the actual requirements or design.

Referring to FIG. 4B and FIG. 4C, a contact C3 is disposed respectively on surfaces of two ends (i.e., E1 and E2) of each of the heaters 1200. The contact C3 may be connected to pads 1302a and 1302b above via an upper interconnect structure 1034, so that the heater 1200 of the memory chip 1000 can be electrically connected to the control chip 2000 via the upper interconnect structure 1034 and the pads 1302a and 1302b. The material of the pads 1302a and 1302b is, for example, copper.

FIG. 5A to FIG. 5E are schematic perspective views of a control chip according to an embodiment of the disclosure. FIG. 6A is a schematic perspective view of a memory chip and a control chip according to an embodiment of the disclosure. FIG. 6B is a schematic circuit view of FIG. 6A.

Figure 5A:
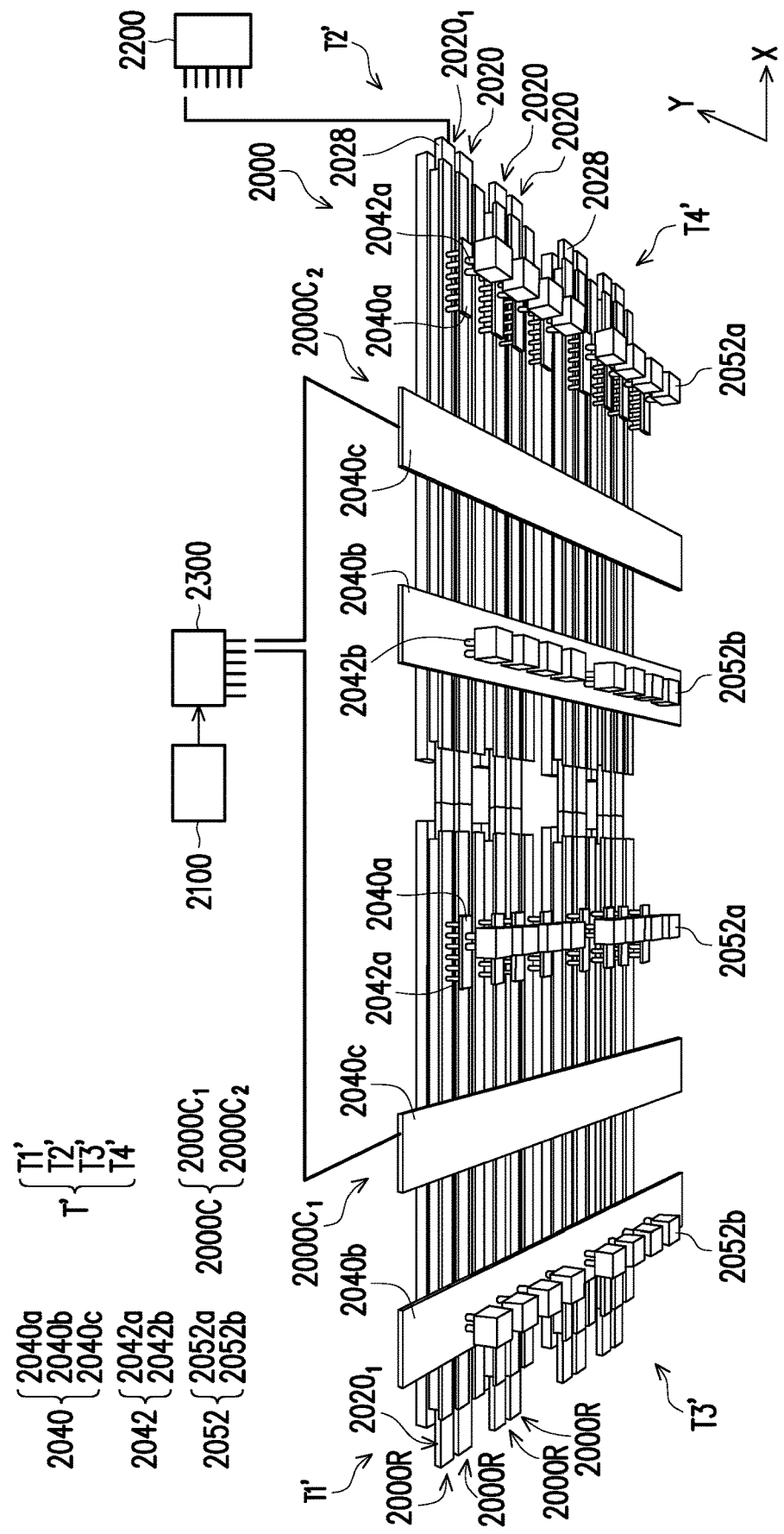
FIG. 5A to FIG. 5E are schematic perspective views of a control chip according to an embodiment of the disclosure.
Figure 6B:
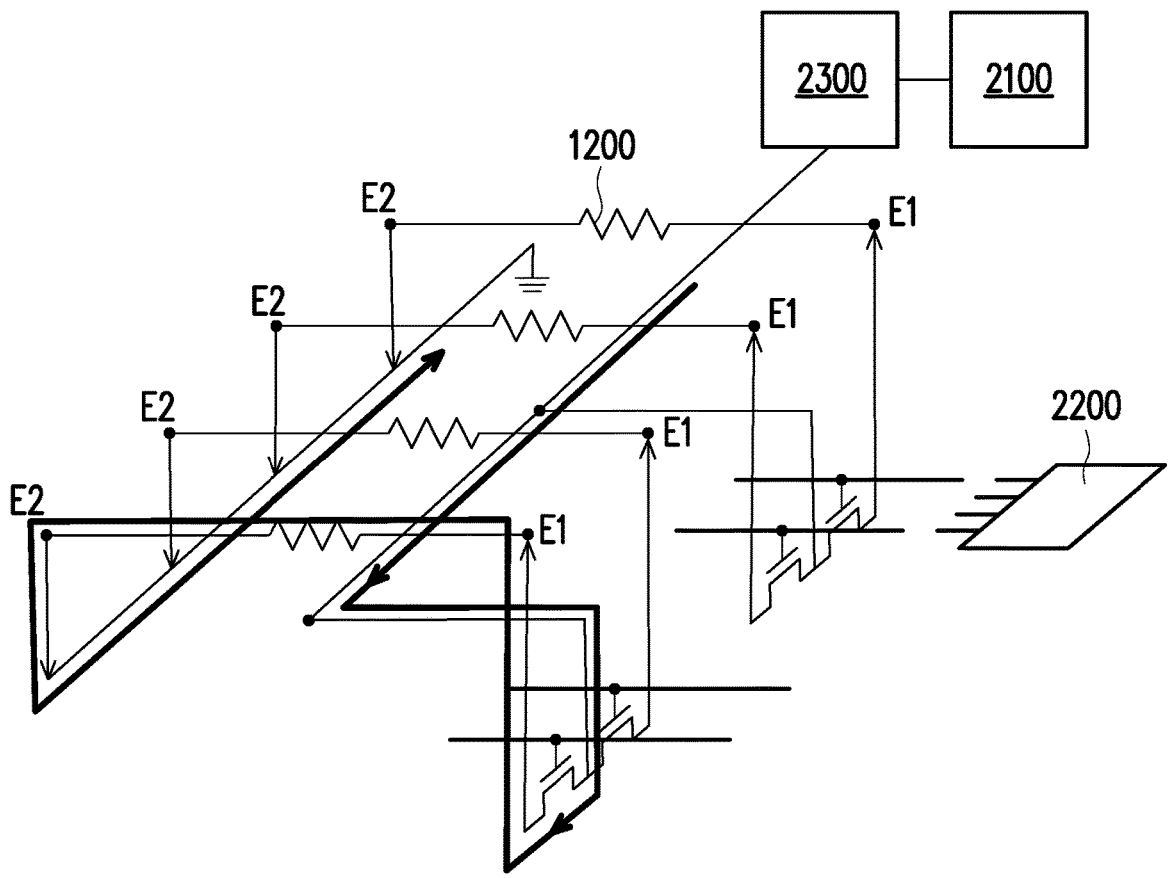
FIG. 6B is a schematic circuit view of FIG. 6A.

Referring to FIG. 5A, the control chip 2000 may include a plurality of tiles T'. The tiles T' may be arranged in an array. In this embodiment, four tiles T' (e.g., T1' to T4') will be taken as an example for illustration. Among the four tiles T', the tile T1' and the tile T2' are arranged in a row, and the tile T3' and the tile T4' are arranged in another row. The tile T1' and the tile T3' are arranged in a column, and the tile T2' and the tile T4' are arranged in another column.

Figure 5B:
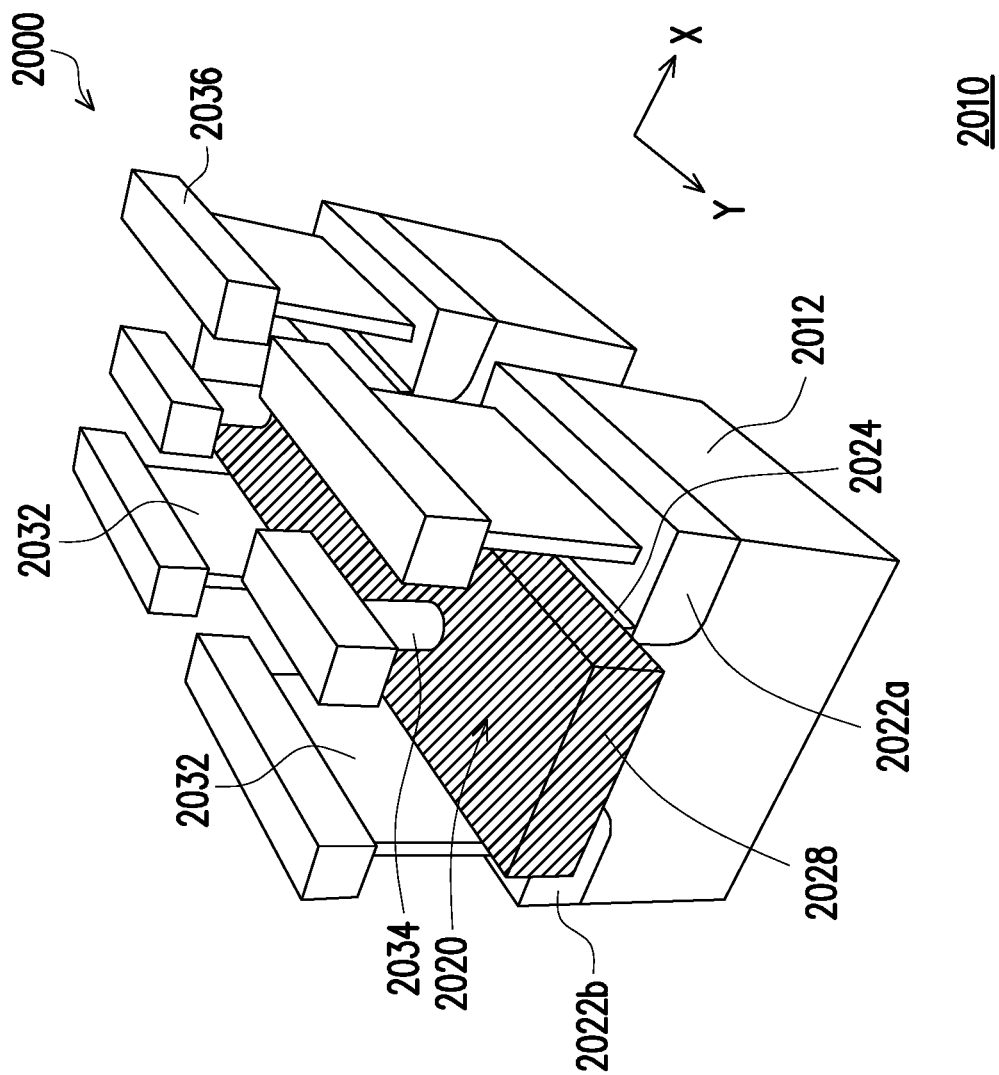
Figure 5C:
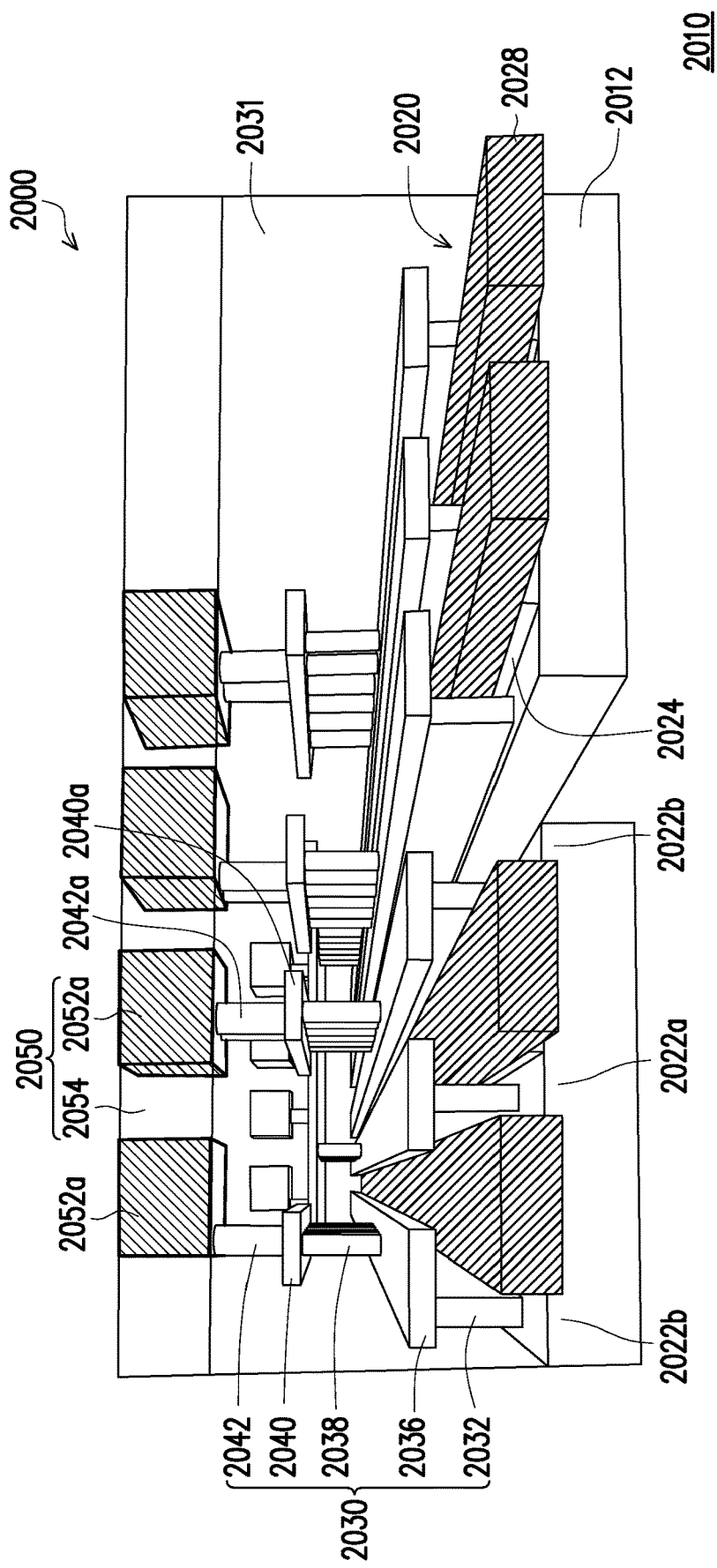
Figure 5D:
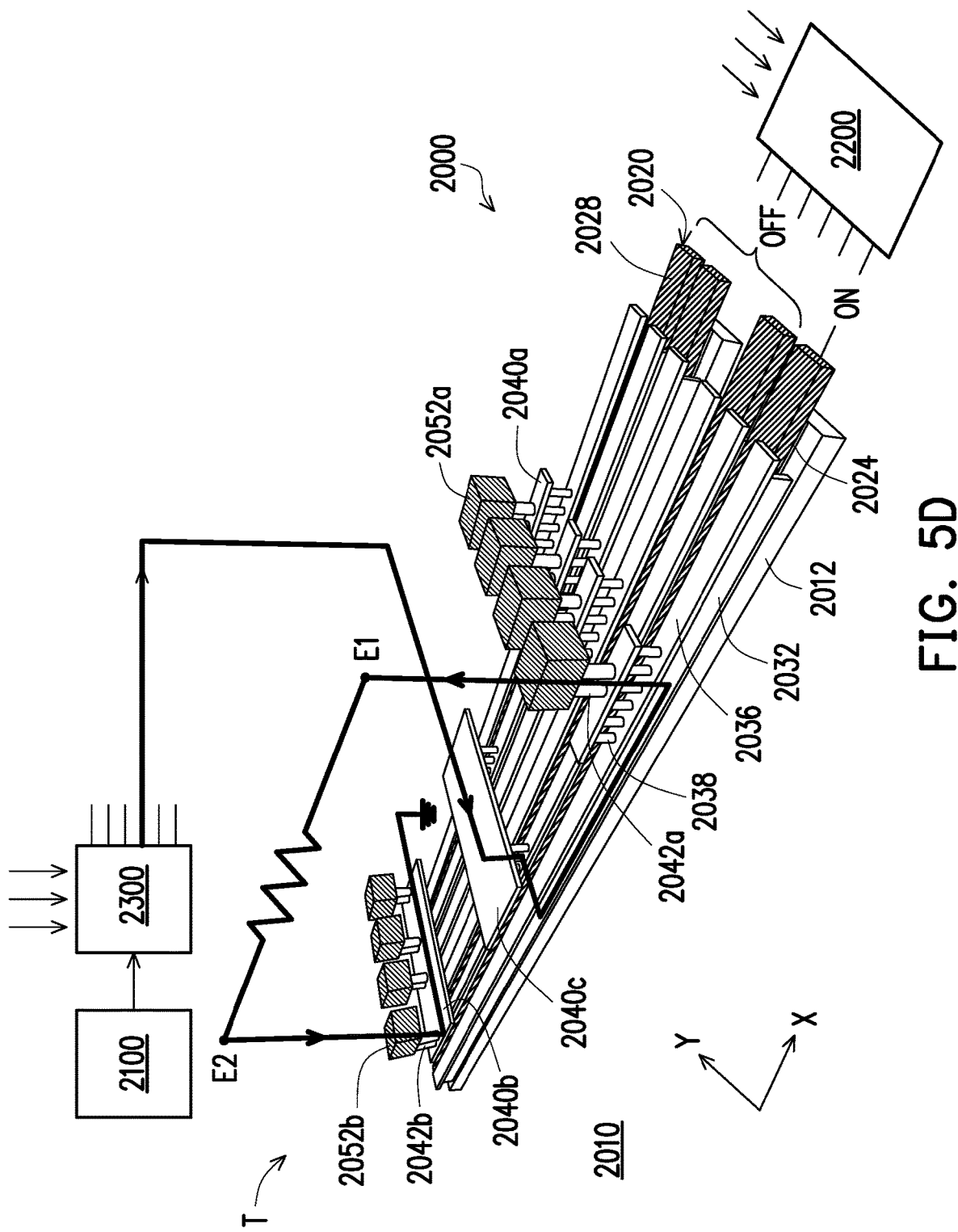
Figure 5E:
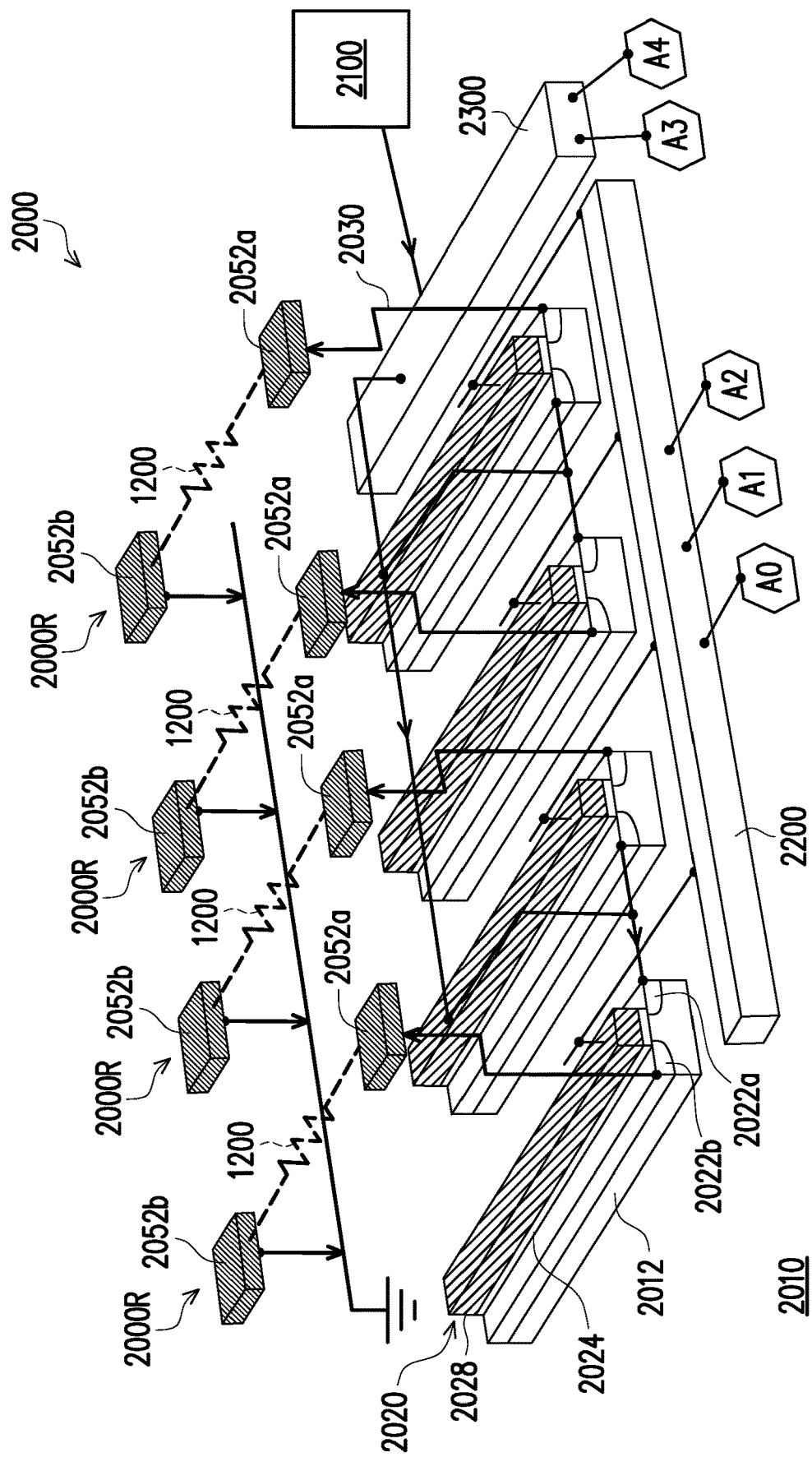

Referring to FIG. 5A and FIG. 5E, each of the tiles T' includes a plurality of driving rows 2000R and columns 2000C. Each of the driving rows 2000R includes a second transistor 2020, a second interconnect structure 2030, and a pad 2052, as shown in FIG. 5E. The second transistor 2020 is disposed on an active region 2012 of a second substrate 2010. The second substrate 2010 may be a semiconductor substrate, such as a silicon substrate. The second transistor 2020 may be a complementary metal-oxide-semiconductor (CMOS) transistor. The second transistor 2020 may be a planar transistor (as shown in FIG. 5A to FIG. 5E) or a fin transistor (as shown in FIG. 8).

Figure 8:
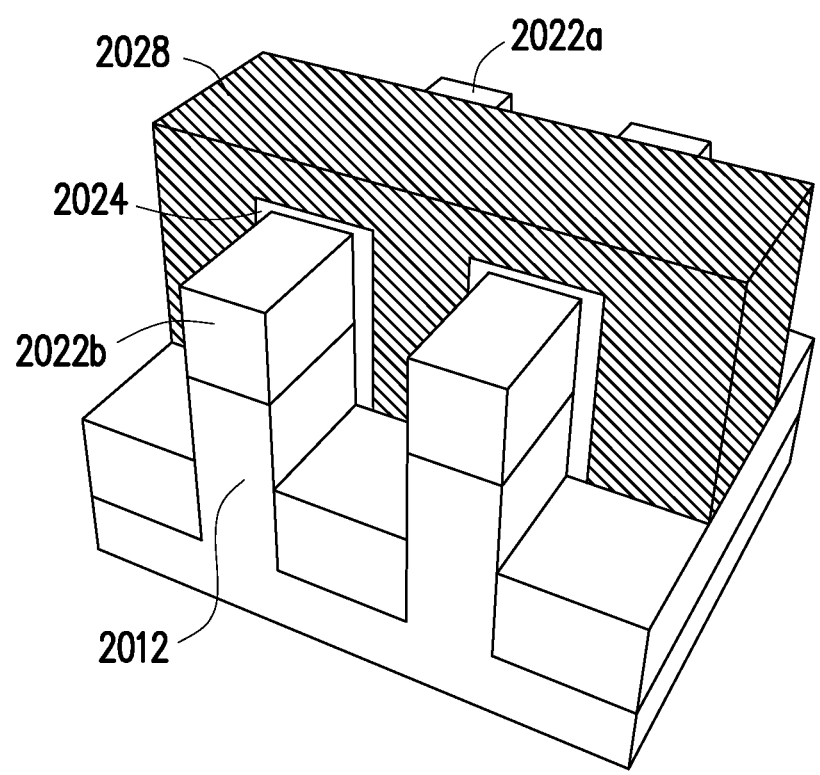
FIG. 8 is a schematic perspective view of a control chip according to another embodiment of the disclosure.

Referring to FIG. 5E, and FIG. 8, the second transistor 2020 includes a gate dielectric layer 2024, a gate layer 2028, a source region 2022a, and a drain region 2022b. The gate dielectric layer 2024 is, for example, silicon oxide or a high dielectric constant material. The gate layer 2028 is, for example, doped polysilicon or tungsten. The gate layer 2028 is located on the gate dielectric layer 2024. The gate layer 2028 has a strip shape, and its extending direction is, for example, the same as the extending direction of the heater 1200 (e.g., extending in the X direction), as shown in FIG. 6A. In some embodiments, the gate layers 2028 of the second transistors 2020 in two adjacent rows (e.g., the tiles T1' and T2', or the tiles T3' and T4') may be electrically connected, as shown in FIG. 5A.

Referring to FIG. 5C and FIG. 5E, the source region 2022a and the drain region 2022b of the second transistor 2020 are disposed in the active region 2012 on two sides of the gate layer 2028. The source region 2022a and the drain region 2022b contain a dopant, such as an N-type or P-type dopant. In some embodiments, two adjacent second transistors 2020 share a source region 2022a.

Referring to FIG. 5B and FIG. 5C, the second interconnect structure 2030 is located on the second transistors 2020. The second interconnect structure 2030 includes a dielectric layer 2031 (as shown in FIG. 5C), and a plurality of contacts 2032 and 2034, a plurality of conductive lines 2036 and 2040, and a plurality of vias 2038 and 2042 which are located in the dielectric layer 2031. The contacts 2032 respectively land on the source region 2022a and the drain region 2022b, and are electrically connected to the source region 2022a and the drain region 2022b. The contact 2034 lands on the gate layer 2028 and is electrically connected to the gate layer 2028. The contact 2032 has a strip shape which extends along the X direction and is substantially parallel to the gate layer 2028, as shown in FIG. 5B and FIG. 5D. The shape of the contact 2034 is different from the shape of the contact 2032 and may be, for example, a columnar shape, as shown in FIG. 5B. The conductive lines 2036 and 2040 (as shown in FIG. 5C) are respectively disposed on the contacts 2032 and 2034. The conductive line 2036 and the conductive line 2040 are electrically insulated from each other by the via 2038. The via 2042 is disposed on the conductive line 2040 and is electrically connected the conductive line 2040 to a bonding layer 2050 above. The dielectric layer 2031 is, for example, silicon oxide. The contacts 2032 and 2034, the conductive lines 2036 and 2040, and the vias 2038 and 2042 include a metal layer such as tungsten or copper. The contacts 2032 and 2034, the conductive lines 2036 and 2040, and the vias 2038 and 2042 may further include a barrier layer (not shown), such as titanium, tantalum, titanium nitride, tantalum nitride, or a combination thereof.

Referring to FIG. 5C, the pad 2052 of each of the driving rows 2000R is a part of the bonding layer 2050 of the control chip 2000. The bonding layer 2050 includes the pad 2052 and an insulating layer 2054. The insulating layer 2054 is located on the second interconnect structure 2030. The pad 2052 is located in the insulating layer 2054 and is electrically connected to the via 2042 of the second interconnect structure 2030. The material of the pad 2052 is, for example, copper. The material of the insulating layer 2054 is, for example, silicon oxide.

Referring to FIG. 5A and FIG. 5E, the pad 2052 includes a pad 2052a and a pad 2052b. Specifically, each of the driving rows 2000R includes a pair of pads 2052a and 2052b disposed along the X direction. The pad 2052a is electrically connected to the first end E1 of the heater 1200; the pad 2052b is electrically connected to the second end E2 of the heater 1200 and is grounded, as shown in FIG. 1A, FIG. 1B and FIG. 6A. Referring to FIG. 5C and FIG. 5D, each pad 2052a is electrically connected to a conductive line 2040a below via a via 2042a. The conductive lines 2040a in the same tile T' are separated and electrically isolated from each other, so as to be respectively electrically connected to the drain region 2022b of the second transistor 2020, as shown in FIG. 5A and FIG. 5C. Each pad 2052b is electrically connected to a conductive line 2040b below via a via 2042b, as shown in FIG. 5D. The pads 2052b of the tiles T' in the same column (e.g., the tiles T1' and T3', or the tiles T2' and T4') are electrically connected to the ground via the same conductive line 2040b, as shown in FIG. 5A and FIG. 5D.

Referring to FIG. 5C, FIG. 1A, and FIG. 1B, the bonding layer 2050 of the control chip 2000 and the bonding layer 1300 of the memory chip 1000 are bonded to each other to form a bonding structure 3000. Specifically, the position of the insulating layer 2054 of the control chip 2000 and the position of the insulating layer 1304 of the memory chip 1000 correspond to each other and are bonded to each other. The positions of the pads 2052a and 2052b of the control chip 2000 and the positions of the pads 1302a and 1302b of the memory chip 1000 correspond to each other and are bonded to each other.

Referring to FIG. 5A, FIG. 5C and FIG. 5D, the column 2000C of the control chip 2000 electrically couples a plurality of shared source regions 2022a of multiple second transistors 2020 of the tiles T' in the same column (e.g., the tiles T1' and T3', or the tiles T2' and T4') to a global power supply 2100 via a conductive line 2040c.

Referring to FIG. 5A, FIG. 5C and FIG. 5D, the drain region 2022b of the second transistor 2020 of the control chip 2000 is connected to the second interconnect structure 2030 and the pad 2052a of the bonding layer 2050, as shown in FIG. 5C. The pad 2052a is electrically connected to the pad 1302a connected to the first end E1 of the heater 1200 of the memory chip 1000 as shown in FIG. 6A. In an embodiment, each of the driving rows 2000R of the control chip 2000 may control one heater 1200 of one corresponding sector B of the memory chip 1000, as shown in FIG. 6A and FIG. 6B.

Referring to FIG. 5E, in some embodiments, the control chip 2000 further includes a column decoder 2300 and a row decoder 2200. The column decoder 2300 is electrically connected to the global power supply 2100. After receiving column address signals A3 and A4, the column decoder 2300 selects multiple tiles (two tiles in this example, e.g., the tiles T1' and T3' in FIG. 5A) of one column (e.g., a column 2000C$_1$ in FIG. 5A). Accordingly, the global power supply 2100 is provided to the shared source regions 2022a of the second transistors 2020 of each of the tiles (e.g., the tiles T1' and T3' in FIG. 5A) of the selected column (e.g., the column 2000C$_1$ in FIG. 5A) via the conductive line 2040c (shown in FIG. 5A) of the second interconnect structure 2030. The row decoder 2200 is electrically connected to the gate layers 2028 of the second transistors 2020 of the driving rows 2000R. After receiving row address signals A0 to A2 (or referred to as control signals), the row decoder 2200 decodes the inputted row address signals to select and turn on one (e.g., a second transistor 2020$_1$ in FIG. 5A) or more of the second transistors 2020.

Generally, the memory chip 1000 includes a control logic unit for controlling the memory array, and the register in the control logic unit stores a status signal of an erase count of the memory array of each sector B. When the erase count reaches a predetermined count, the status signal is sent to the control chip 2000.

Referring to FIG. 6A and FIG. 6B, during the healing process, the control chip 2000 may generate a row address signal and a column address signal corresponding to the tile T and the sector B (e.g., the sector B1 of the tile T1 in FIG. 6A) that need healing based on the received status signal, and transmit the row address signal and the column address signal respectively to the row decoder 2200 and the column decoder 2300. The column decoder 2300 selects one column (e.g., the column 2000C$_1$ in FIG. 6A) according to the received column address signal to provide the global power supply 2100 to the conductive line 2040c of the tiles (e.g., the tiles T1' and T3' in FIG. 5A) located in this column (e.g., the column 2000C$_1$ in FIG. 6A). The row decoder 2200 selects and turns on the second transistor 2020$_1$ of one driving row 2000R$_1$ according to the received row address signal. Therefore, current can flow from the global power supply 2100 into the source region 2022a of the second transistor 2020$_1$ via the conductive line 2040c, pass through the channel and the drain region 2022b of the second transistor 2020$_1$, then flow into the pad 1302a of the memory chip 1000 via the second interconnect structure 2030 and the pad 2052a, and then enter a first end E1 of a heater 1200 (e.g., 1200$_1$). Afterwards, the current flow in the heater 1200$_1$ and flows out a second end E2 of the heater 1200$_1$ via the pad 1302b of the memory chip 1000, then enters the pad 2052b of the control chip 2000, and then is electrically connected to the ground via the conductive line 2040b. In the embodiment of the disclosure, with the second transistor (driver) 2020 (e.g., 2020$_1$) of the control chip 2000, it is possible to provide a high driving current to a specific heater 1200 (e.g., 1200$_1$), so that the conductor serving as the heater 1200 (e.g., 1200$_1$) is heated to heal the charge storage layer in the 3D flash memory structure 1100 of a specific sector B (e.g., B1) in a specific tile T (e.g., T1).

Referring to FIG. 1A and FIG. 1B, in some embodiments, in the healing process, the control chip 2000 may drive one heater 1200 (e.g., 1200$_1$) to heal the charge storage layer in the 3D flash memory structure 1100 (e.g., 1100$_1$) of one sector B (e.g., B1). Referring to FIG. 1B, in other embodiments, when healing is performed, the control chip 2000 may also simultaneously drive two heaters 1200 (e.g., 1200$_2$ and 1200$_3$) to heal the charge storage layer in the 3D flash memory structure 1100 (e.g., 1100$_2$) of one sector B (e.g., B2).

Figure 7A:
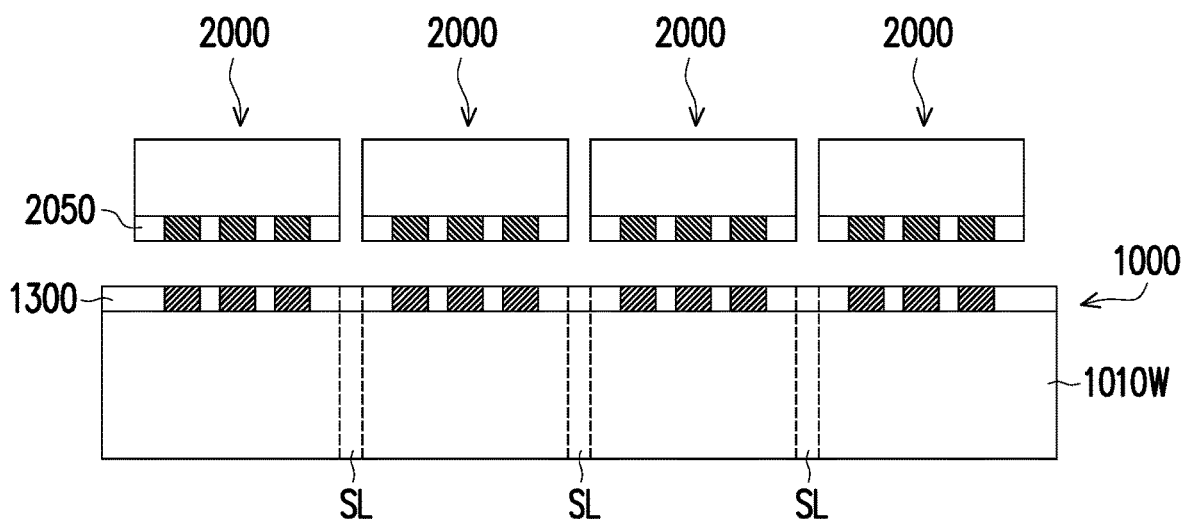
FIG. 7A to FIG. 7C show schematic cross-sectional views of a process of fabricating a 3D flash memory module chip of the disclosure.
Figure 7B:
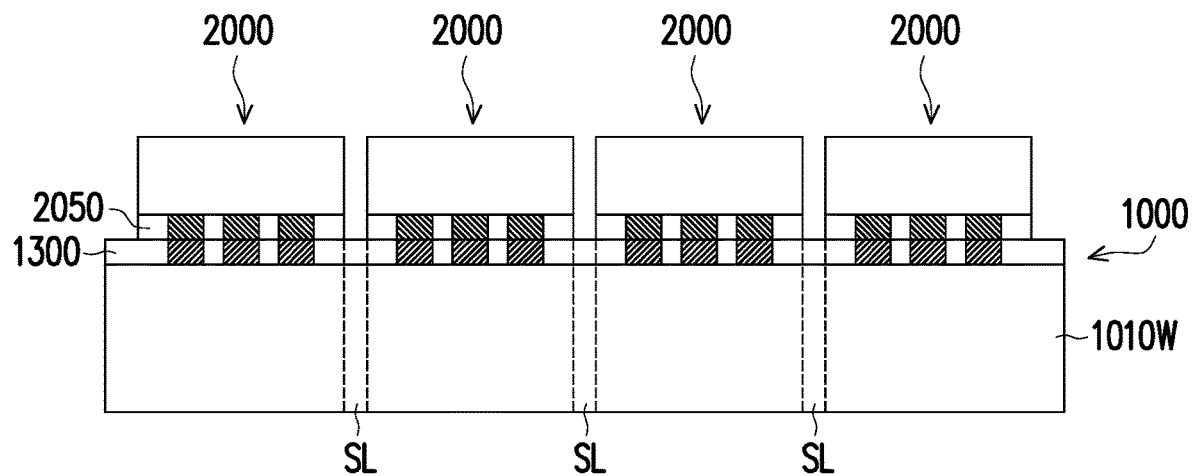
Figure 7C:
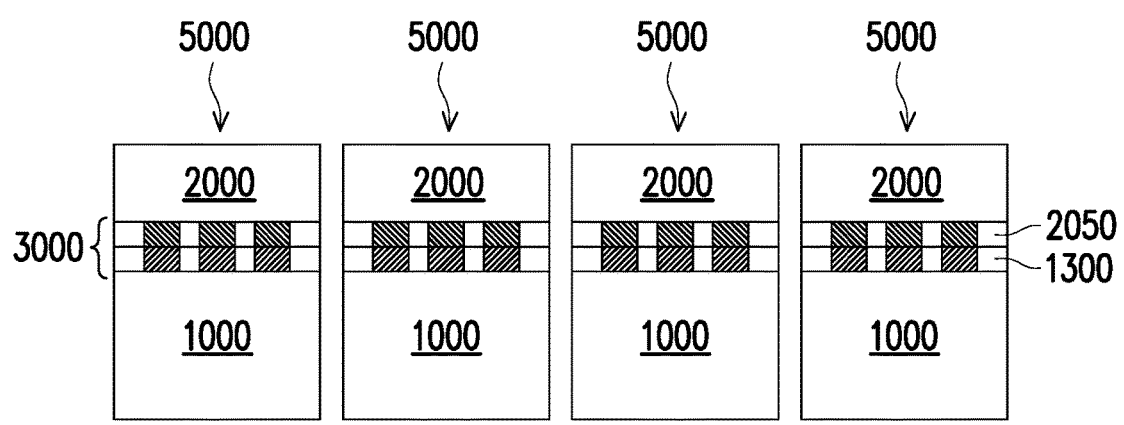

FIG. 7A to FIG. 7C show schematic cross-sectional views of a process of fabricating a 3D flash memory module chip of the disclosure.

Referring to FIG. 7A, a wafer 1010W is provided, and a plurality of memory chips 1000 are formed on the wafer 1010W. Scribe lines SL are provided between the memory chips 1000. The method of forming the memory chip 1000 is as follows. Referring to FIG. 3B, one or more active devices (e.g., first transistors) 1020 are first formed on the wafer 1010W. Next, a lower interconnect structure 1032 is formed on the active devices 1020. The lower interconnect structure 1032 may be formed by any known method, such as damascene, dual-damascene, and the like. Afterwards, an insulating stack structure (not shown) formed by alternately stacking one insulating layer (e.g., silicon oxide) 54 and another insulating layer (not shown, e.g., silicon nitride) is formed on the lower interconnect structure 1032. Next, according to any known method, a tunneling layer 14 of a charge storage structure 40, a channel pillar 16, and conductive pillars 32a and 32b are formed in the insulating stack structure. The material of the tunneling layer 14 may be a dielectric material, such as silicon oxide. The material of the channel pillar 16 may be a semiconductor, such as undoped polysilicon. The conductive pillars 32a and 32b are, for example, doped polysilicon.

Then, lithography and etching processes are performed to form slit trenches 1110 in the insulating stack structure to divide the insulating stack structure into a plurality of sectors B.

Afterwards, a gate replacement process is performed to form a gate stack structure 52. First, an etching process is performed to inject an etchant into the slit trenches 1110 to remove the another insulating layer in the insulating stack structure to form a plurality of horizontal openings 34 and then form gate layers 38 in the horizontal openings 34. In some embodiments, before the gate layer 38 is formed, a charge storage layer 12 and a blocking layer 36 are also formed in the horizontal opening 34. The charge storage layer 12 is, for example, silicon nitride. The material of the blocking layer 36 is, for example, a high dielectric constant material having a dielectric constant greater than or equal to 7, such as aluminum oxide ($Al_2O_3$), hafnium oxide ($HfO_2$), lanthanum oxide ($La_2O_5$), transition metal oxide, lanthanide oxide, or combinations thereof. The gate layer 38 is, for example, tungsten. In some embodiments, before the gate layers 38 are formed, a barrier layer 37 is formed. The material of the barrier layer 37 is, for example, titanium (Ti), titanium nitride (TiN), tantalum (Ta), tantalum nitride (TaN), or a combination thereof.

Next, slits SLT are formed in the slit trenches 1110. The method of forming the slits SLT includes filling an insulating filling material on the gate stack structure 52 and in the slit trenches 1110, and then removing the excessive insulating filling material on the gate stack structure 52 through an etch-back process or a planarization process. The insulating filling material is, for example, silicon oxide.

Afterwards, an upper interconnect structure 1034 (including a local bit line $LBL_n$, a local source line $LSL_n$, a global bit line $GBL_n$ and a global source line $GSL_n$) is formed on the gate stack structure 52. The upper interconnect structure 1034 may be formed by any known method, such as damascene, dual-damascene, and the like, which shall not be described in detail herein.

Referring to FIG. 3A and FIG. 3B, in this embodiment, after the upper interconnect structure 1034 (including the local bit line $LBL_n$, the local source line $LSL_n$, the global bit line $GBL_n$, and the global source line $GSL_n$) is formed, a heater 1200 is further formed above the upper interconnect structure 1034. The method of forming the heater 1200 includes, for example, forming a dielectric layer 1040 above the upper interconnect structure 1034 first. The material of the dielectric layer 1040 is, for example, silicon oxide. In some embodiments, a planarization process such as a chemical mechanical planarization process is further performed, so that the dielectric layer 1040 has a flat surface. Afterwards, lithography and etching processes are performed to form a plurality of grooves OP1 in the dielectric layer 1040. Then, a barrier material layer and a metal material layer are sequentially formed on the dielectric layer 1040 and in the grooves. Next, a planarization process such as a chemical mechanical planarization process is performed to remove the barrier material layer and the metal material layer on the surface of the dielectric layer 1040 and form a barrier layer 1204 and a metal layer 1202 in the groove. The metal material layer is, for example, copper or tungsten. The barrier material layer is, for example, titanium, tantalum, titanium nitride, tantalum nitride, or a combination thereof.

Referring to FIG. 3B, after the heater 1200 is formed, a bonding layer 1300 is formed. The method of forming the bonding layer 1300 is as follows. First, an insulating layer 1304 is first formed on the heater 1200 and the dielectric layer 1040, and then lithography and etching processes are performed to form a plurality of pad openings OP2 in the insulating layer 1304. The bottom of the pad opening OP2 exposes the heater 1200. Afterwards, a conductive layer is formed on the insulating layer 1304 and in the pad openings OP2. Then, a planarization process such as a chemical mechanical planarization process is performed to remove the conductive layer on the insulating layer 1304 and form pads 1302 in the pad openings OP2.

In the above embodiment, the heater 1200 of the memory chip 1000 is formed after the upper interconnect structure 1034 is formed. In other embodiments, the heater 1200 of the memory chip 1000 may be formed before the upper interconnect structure 1034 is formed.

Referring to FIG. 4C, the heater 1200 of the memory chip 1000 is formed in the slit trench 1110 between the gate stack structures 52 after the gate stack structure 52 of the 3D flash memory structure 1100 is formed and before the upper interconnect structure 1034 (including the local bit line $LBL_n$, the local source line $LSL_n$, the global bit line $GBL_n$, and the global source line $GSL_n$) is formed.

Referring to FIG. 4A and FIG. 4C, the method of forming the heater 1200 includes, for example, forming a liner material layer in the slit trench 1110 first. The liner material layer is, for example, silicon oxide or silicon nitride. Next, a barrier material layer and a metal material layer are sequentially formed on the gate stack structure 52 and in the slit trench 1110. Then, a planarization process such as a chemical mechanical planarization process is performed to remove the barrier material layer and the metal material layer on the surface of the gate stack structure 52 and form an insulating liner layer 1112, a barrier layer 1204, and a metal layer 1202 in the slit trench 1110. The metal material layer is, for example, copper or tungsten. The barrier material layer is, for example, titanium, tantalum, titanium nitride, tantalum nitride, or a combination thereof.

Referring to FIG. 4B and FIG. 4C, after the heater 1200 is formed, an upper interconnect structure 1034 (including a local bit line $LBL_n$, a local source line $LSL_n$, a global bit line $GBL_n$, and a global source line $GSL_n$) is formed. Afterwards, a bonding layer 1300 is formed on the upper interconnect structure 1034 according to the above-mentioned method.

Referring to FIG. 7A, a plurality of control chips 2000 are provided. The method of forming the control chips 2000 is as follows. Referring to FIG. 5C, second transistors 2020 are formed on a second substrate (wafer) 2010. Then, a second interconnect structure 2030 is formed on the second transistors 2020. The second interconnect structure 2030 may be formed by any known method, such as damascene, dual-damascene, and the like. Afterwards, a bonding layer 2050 is formed on the second interconnect structure 2030 according to the above-mentioned method. Next, dicing is performed to form a plurality of control chips 2000.

Referring to FIG. 7B, the bonding layer 2050 of the control chips 2000 and the bonding layer 1300 of the memory chips 1000 are bonded to form a bonding structure 3000. The bonding method is, for example, a hybrid bonding process. In some embodiments, after the control chips 2000 are bonded with the memory chips 1000 on the wafer 1010W, an encapsulation layer (not shown) is further formed around the sidewalls of the control chips 2000.

Referring to FIG. 7C, a dicing process is performed to form a plurality of mutually independent 3D flash memory module chips 5000.

In summary of the above, in the disclosure, the memory chip and the control chip are bonded to form the 3D flash memory module chip. With the driver of the control chip providing a high driving current to heat the heater in the memory chip, it is possible to heal the charge storage structure of the flash memory to achieve a higher erase speed and improve the endurance of the flash memory. Furthermore, the control chip can locally heat the corresponding sector according to the status signal of the control logic unit of the memory chip. In addition, in the 3D flash memory module chip formed by bonding, the control chip may be manufactured separately, and it is not required to form a large-area heater controller in the memory chip. Therefore, it is possible to prevent the heater controller from occupying the area of the memory chip, and the control chip may be manufactured by a less advanced process so as to reduce the cost of the process.

What is claimed is:

1. A 3D flash memory module chip comprising:
a memory chip comprising:
a plurality of tiles each comprising a plurality of 3D flash memory structures; and
a plurality of heaters disposed around the 3D flash memory structures of each of the tiles; and
a control chip bonded with the memory chip to drive at least one of the heaters, wherein the control chip comprises:
a plurality of driving rows each comprising:
a second transistor located on a second substrate, wherein a source region of the second transistor is electrically connected to a global power supply;
a first pad electrically connected to a drain region of the second transistor and electrically connected to a first end of one of the heaters; and
a second pad that is grounded and is electrically connected to a second end of the one of the heaters.

2. The 3D flash memory module chip according to claim 1, wherein the heaters are disposed above the 3D flash memory structures and are adjacent to the control chip.

3. The 3D flash memory module chip according to claim 1, wherein the heaters are disposed in a plurality of slit trenches between the 3D flash memory structures.

4. The 3D flash memory module chip according to claim 1, wherein the memory chip further comprises:
a plurality of first transistors located on a first substrate;
the 3D flash memory structures located above the first transistors; and
a first interconnect structure, wherein the 3D flash memory structures are embedded in the first interconnect structure.

5. The 3D flash memory module chip according to claim 4, wherein the first interconnect structure comprises:
a lower interconnect structure located between the 3D flash memory structures and the first transistors and electrically connecting the 3D flash memory structures and the first transistors; and
an upper interconnect structure located on the 3D flash memory structures and electrically connecting the 3D flash memory structures.

6. The 3D flash memory module chip according to claim 1, wherein the control chip further comprises:
a row decoder electrically coupled to a plurality of gate layers of the second transistors of the driving rows; and
a column decoder electrically coupled to a plurality of source regions of the second transistors and the global power supply.

7. The 3D flash memory module chip according to claim 1, wherein the control chip comprises a plurality of tiles arranged in an array, wherein the source regions of the second transistors of the tiles in a same column are electrically connected to each other.

8. The 3D flash memory module chip according to claim 1, wherein the control chip and the memory chip are bonded by a bonding structure.

9. The 3D flash memory module chip according to claim 1, wherein the plurality of 3D flash memory structures comprises a plurality of 3D AND flash memory structure, a plurality of 3D NAND flash memory structure, or a plurality of 3D NOR flash memory structure.

10. A method of fabricating a 3D flash memory module chip, comprising:
forming a memory chip, comprising:
forming a plurality of tiles on a first substrate, wherein each of the tiles comprises a plurality of 3D flash memory structures; and
forming a plurality of heaters around the 3D flash memory structures of each of the tiles;
forming a control chip; and
bonding the control chip and the memory chip, wherein the control chip is configured to drive the heaters,
wherein the step of forming the control chip comprises:
forming a plurality of driving rows, wherein formation of each of the driving rows comprises:
forming a second transistor on a second substrate;
forming a second interconnect structure on the second transistor, wherein a source region of the second transistor is electrically coupled to a global power supply via the second interconnect structure;
forming a first pad on the second interconnect structure, wherein the first pad is electrically connected to a drain region of the second transistor via the second interconnect structure;
forming a second pad on the second interconnect structure, wherein the second pad is electrically connected to ground via the second interconnect structure;
electrically connecting the first pad to a first end of one of the heaters; and
electrically connecting the second pad that to a second end of the one of the heaters.

11. The method of fabricating a 3D flash memory module chip according to claim 10, wherein the heaters are formed above the 3D flash memory structures.

12. The method of fabricating a 3D flash memory module chip according to claim 10, wherein the heaters are formed in a plurality of slit trenches around the 3D flash memory structures.

13. The method of fabricating a 3D flash memory module chip according to claim 10, wherein the step of forming the memory chip further comprises:
forming a plurality of first transistors on the first substrate; and
forming the 3D flash memory structures above the first transistors.

14. The method of fabricating a 3D flash memory module chip according to claim 10, wherein the control chip and the memory chip are hybrid bonded by a bonding structure.

15. The method of fabricating a 3D flash memory module chip according to claim 10, wherein the plurality of 3D flash memory structures comprises a plurality of 3D AND flash memory structure, a plurality of 3D NAND flash memory structure, or a plurality of 3D NOR flash memory structure.

* * * * *